US010289084B2

(12) United States Patent
Paul et al.

(10) Patent No.: US 10,289,084 B2
(45) Date of Patent: May 14, 2019

(54) STEAM BREAKTHROUGH DETECTION AND PREVENTION FOR STEAM ASSISTED GRAVITY DRAINAGE WELLS

(71) Applicant: ACCENTURE GLOBAL SOLUTIONS LIMITED, Dublin (IE)

(72) Inventors: Sanjoy Paul, Sugar Land, TX (US); Farrukh Akram, Calgary (CA)

(73) Assignee: ACCENTURE GLOBAL SOLUTIONS LIMITED, Dublin (IE)

( * ) Notice: Subject to any disclaimer, the term of this patent is extended or adjusted under 35 U.S.C. 154(b) by 402 days.

(21) Appl. No.: 15/170,689

(22) Filed: Jun. 1, 2016

(65) Prior Publication Data

US 2017/0350217 A1    Dec. 7, 2017

(51) Int. Cl.
G06F 17/50     (2006.01)
G05B 15/02     (2006.01)
E21B 43/24     (2006.01)
G06F 11/32     (2006.01)

(52) U.S. Cl.
CPC .......... G05B 15/02 (2013.01); E21B 43/2406 (2013.01); G06F 11/324 (2013.01); G06F 17/5009 (2013.01)

(58) Field of Classification Search
USPC .................. 703/2, 5; 166/268, 154
See application file for complete search history.

(56) References Cited

U.S. PATENT DOCUMENTS

| 5,350,014 A * | 9/1994 | McKay | E21B 43/24 166/272.3 |
|---|---|---|---|
| 9,394,769 B2 * | 7/2016 | Nenniger | E21B 43/12 |
| 9,702,233 B2 * | 7/2017 | Stahl | E21B 43/14 |
| 2011/0288778 A1 * | 11/2011 | Pavlovich | E21B 43/2406 702/12 |
| 2015/0013978 A1 * | 1/2015 | Nenniger | E21B 43/12 166/268 |
| 2015/0330179 A1 * | 11/2015 | James | C04B 28/04 166/293 |
| 2015/0354330 A1 * | 12/2015 | Stahl | E21B 43/14 166/254.1 |
| 2017/0226836 A1 * | 8/2017 | Sanders | E21B 43/2408 |

* cited by examiner

Primary Examiner — Thai Q Phan
(74) Attorney, Agent, or Firm — Mannava & Kang, P.C.

(57) ABSTRACT

According to examples, steam breakthrough detection and prevention for a steam assisted gravity drainage (SAGD) well may include accessing real-time data associated with the SAGD well. Parameter values associated with an operation of the SAGD well may be determined based on the real-time data associated with the SAGD well. A potential of occurrence of steam breakthrough may be determined based on an analysis of selected parameter values from the parameter values associated with the operation of the SAGD well. A procedure to prevent the occurrence of the steam breakthrough may be determined based on an application of hypothetical parameter values associated with the operation of the SAGD well to an engineering analysis model associated with the SAGD well. Further, the operation of the SAGD well may be controlled based on the procedure to prevent the occurrence of the steam breakthrough.

20 Claims, 22 Drawing Sheets

STEAM BREAKTHROUGH DETECTION AND PREVENTION FOR STEAM ASSISTED GRAVITY DRAINAGE WELLS

BACKGROUND

With respect to steam assisted gravity drainage (SAGD) wells, SAGD technology may be applied to an oil reservoir to produce heavy crude oil and bitumen. A pair of generally horizontal wells may be drilled into the oil reservoir. Each well may be disposed a few meters apart. The upper well may be designated as an injector well, and the lower well may be designated as a producer well. High pressure steam may be continuously injected into the upper well to heat the oil adjacent to the injector well, and to reduce the viscosity of the oil. The heated oil is caused to drain into the lower producer well, where the heated oil is pumped out to produce oil.

With respect to SAGD wells, steam breakthrough refers to the entry of the steam into the producer well. If a sufficient amount of steam enters into the producer well, the steam may damage production equipment such as pumps that are used to pump the oil from the producer well, corrode the producer well, etc.

BRIEF DESCRIPTION OF DRAWINGS

Features of the present disclosure are illustrated by way of examples shown in the following figures. In the following figures, like numerals indicate like elements, in which.

DETAILED DESCRIPTION

Figure 1:
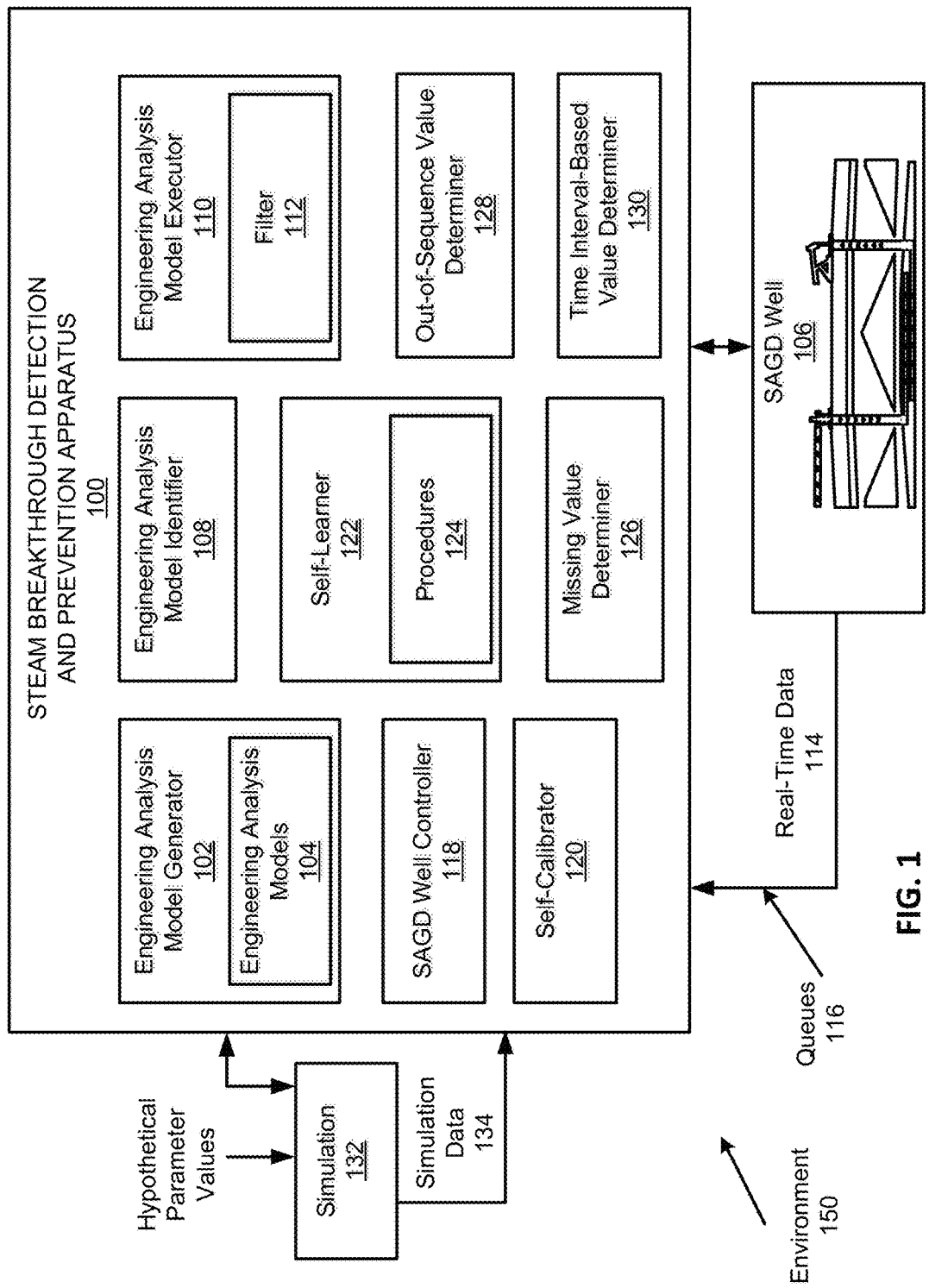
FIG. 1 illustrates an environment including an architecture of a steam breakthrough detection and prevention apparatus, according to an example of the present disclosure.

For simplicity and illustrative purposes, the present disclosure is described by referring mainly to examples thereof. In the following description, details are set forth in order to provide an understanding of the present disclosure. It will be readily apparent however, that the present disclosure may be practiced without limitation to these details.

Throughout the present disclosure, the terms "a" and "an" are intended to denote at least one of a particular element. As used herein, the term "includes" means includes but not limited to, the term "including" means including but not limited to. The term "based on" means based at least in part on.

For SAGD wells, control of operations of the SAGD wells may be based on factors such as an SAGD well operator's experience, improvements in industry practices related to SAGD wells, historical data analysis, etc. However, such experience, improvements, and historical data analysis are typically used to address problems once they have occurred, or are beginning to occur, based on a comparison of a current scenario to past scenarios that result in problems. For example, once a problem related to steam breakthrough has occurred, the time needed to address the problem may result in economic loss related to oil production, expensive remedial measures, etc. Further, in certain cases, once a problem related to steam breakthrough has occurred, lack of experience and/or other factors may result in production equipment damage, unplanned downtime, and production losses. According to examples of the present disclosure, a steam breakthrough detection and prevention apparatus solves these challenges by making it possible for the real-time and continuous monitoring and control of operations related to SAGD wells, by predicting steam breakthrough by detecting the potential of the occurrence of steam breakthrough, and by implementing procedures to prevent the occurrence of steam breakthrough.

The steam breakthrough detection and prevention apparatus, and methods for steam breakthrough detection and prevention disclosed herein may emulate the function of an SAGD well to a relatively high degree of precision. The apparatus disclosed herein may represent a digital version of an SAGD well.

As disclosed herein, an SAGD well may include an upper well that is designated as an injector well, and a lower well that is designated as a producer well. For the injector and producer wells, generally vertical wells may be used to drill the corresponding generally horizontal wells. For the injector well, a position or wellhead at the top of the injector well where a steam injector is located may be designated as an injector well top hole. The injector well top hole may be positioned above ground, and on top of the well. A position at the bottom of the injector well where the well turns from the generally vertical to the generally horizontal position, or at the end of the injector well, may be designated as an injector well bottom hole. In this regard, the injector well bottom hole may be designated by the point where a measurement is being taken, or a point which has been set as a reference for calculations as disclosed herein. Similarly, a position or wellhead at the top of the producer well where an oil producer is located may be designated as a producer well top hole. A position at the bottom of the producer well where the producer well turns from the generally vertical to the generally horizontal position, or at the end of the producer well, may be designated as a producer well bottom hole. In this regard, the producer well bottom hole may be designated by the point where a measurement is being taken, or a point which has been set as a reference for calculations as disclosed herein.

In order to detect steam breakthrough for an SAGD well, based on the producer well bottom hole pressure, the saturation temperature (i.e., boiling point) corresponding to the producer well bottom hole pressure may be determined, for example, from a steam table. For example, assuming that approximately 175° C. represents the saturation temperature for steam, if the temperature of the steam is lower than approximately 175° C., the steam will condense to water. Otherwise, if the temperature of the steam is greater than or equal to approximately 175° C., the steam will remain as vapor.

Based on the sensing of temperature along the length of the producer well, if the temperature at the producer well bottom hole is higher than the saturation temperature for steam (e.g., approximately 175° C.), steam breakthrough is likely to occur.

For the generally horizontal portions of the producer and injector wells, if a steam envelope is within approximately 1-2 meters of the producer well, steam breakthrough is likely to occur. The steam envelope may be described as an area of the oil reservoir that is encompassed by steam emitted from the injector well.

With respect to prevention of steam breakthrough, sub-cool may be described as the difference between the saturation temperature of water at the producer well pressure and the actual temperature of water at the same place where the pressure is measured. A higher liquid level above the producer well corresponds to a lower temperature and a higher sub-cool. The sub-cool level may be monitored by a plurality of temperature and pressure measurement devices within the reservoir. Examples of temperature and pressure measurement devices include thermocouples (single node and multi-node), distributed temperature sensing (DTS) fibre optics cables, bubble tubes, piezometers, and other such devices.

In order to prevent steam breakthrough, the apparatus and methods disclosed herein may control operations of an SAGD well to maintain the temperature in the producer well so that the saturation temperature corresponding to that pressure is approximately 5-20° lower (i.e., sub-cool) than the temperature of the incoming fluid. For example, if the reservoir pressure is 25 bar, the corresponding saturation temperature is 225° C., and if the temperature at the liner is 220° C., the theoretical reservoir sub-cool would be 5° C. However, as an added precaution, the apparatus and methods disclosed herein may implement the further increase/reduction of the producer well bottom hole pressure, for example, by reducing the producer well top hole pressure, such that the saturation temperature is approximately 215° C. (i.e., approximately 15° sub-cool). Thus, the apparatus and methods disclosed herein may control operations of an SAGD well to ensure that the steam condenses to water before it enters the producer well, or the moment steam enters the producer well.

According to an example, the apparatus and methods disclosed herein may control operations of an SAGD well to prevent steam breakthrough by reducing the pressure difference between the injector and producer wells. For example, if the injector well is at approximately 20 bar and the producer well is at approximately 15 bar, then the producer well will draw steam along with fluid due to a higher pressure difference (steam will prefer to move down than to go up). Thus, the apparatus and methods disclosed herein may control operations of an SAGD well to reduce the producer well top hole flow rate (or equivalently increase the producer well top hole pressure), so that the producer well bottom hole pressure will increase, for example, to approximately 17 bar, to thus reduce the pressure differential (i.e., 20 bar–17 bar), and hence eliminate the draw of steam along with fluid.

According to an example, the apparatus and methods disclosed herein may control operations of an SAGD well to prevent steam breakthrough by reducing injection of steam by reducing the flow rate at the injector well top hole. The reduction of the total volume of steam at the injector well top hole results in stabilization of the steam envelope. That is, the reduced amount of energy injected at the injector well top hole results in greater heat loss in the oil reservoir, which results in condensation of steam at the edges of the steam envelope, which makes space for the rise of the steam near the injector well.

According to an example, the apparatus and methods disclosed herein may control operations of an SAGD well to prevent steam breakthrough by reducing pressure at the injector well top hole. For example, assuming that the pressure at the injector well top hole is approximately 20 bar, reducing the pressure at the injector well top hole results in the reduction of the pressure at the injector well bottom hole (e.g., to approximately 18 bar), to thus reduce any pressure differential between the injector and producer wells (e.g., if the pressure at the producer well is approximately 15 bar). Reducing the pressure at the injector well top hole also results in a reduction of the amount of steam, where the steam may be pushed away from the producer well.

According to an example, the apparatus and methods disclosed herein may control operations of an SAGD well to prevent steam breakthrough by directing movement of the steam envelope. For example, the end of the injector and producer wells where the injector and producer wells transition from a generally vertical to a generally horizontal orientation may be designated as a heel of the injector and producer wells. Further, the toe may be described as the location where the injector and producer wells turn from a generally vertical configuration to a generally horizontal configuration, or alternatively, at the end-most locations of the generally horizontal sections of the injector and producer wells, depending on the reference point being used for the calculations. In the event that the steam envelope is closer to the producer well at the producer well heel compared to the producer well toe, the apparatus and methods disclosed herein may control operations of an SAGD well to push steam towards the producer well toe, for example, by increasing the pressure at the producer well heel and/or reducing the pressure at the producer well toe. Alternatively, if the steam envelope is closer to the producer well at the toe compared to the heel, the apparatus and methods disclosed herein may control operations of an SAGD well to push steam towards the producer well heel by increasing the pressure at the producer well toe and/or reducing the pressure at the producer well heel so that steam moves towards the producer well heel.

With respect to control of operations of an SAGD well, the apparatus and methods disclosed herein may provide for the selection and/or generation of engineering analysis models to model a physical component of the SAGD well, or the SAGD well. An engineering analysis model may be described as a digital version of a physical component of the SAGD well, or the SAGD well. For example, an engineering analysis model may be described as a digital version of an injector well of the SAGD well. For an SAGD well, other types of engineering analysis models may include engineering analysis models for an oil reservoir, a producer well, etc. An engineering analysis model may also be based on an experience of a field operator. The engineering analysis model may include an input interface to receive real-time input data with respect to the component of the SAGD well represented by the engineering analysis model, a component analyzer that models the component of the SAGD well represented by the engineering analysis model, and an output interface to generate an output of results of analysis of the real-time input data by the component analyzer.

The component analyzer may include a function or a set of functions that model the steady-state and/or transient behavior of the component of the SAGD well. The steady-state behavior may be described as behavior of the component of the SAGD well at steady-state operation points (e.g., starting, after a predetermined time duration when a steady-state is reached, under a steady-state operational condition of the component of the SAGD well, etc.). For example, the steady-state operation points may be described as points where the pressure and/or flow rate related to the component are at a steady state for a predetermined time duration. The transient behavior of the component of the SAGD well may be described as the time-varying behavior of the component between different steady-state operation points. For example, the transient behavior may be described as behavior where the pressure and/or flow rate related to the component vary during a predetermined time duration.

With respect to temperature and pressure measurements as disclosed herein, such measurements may also be received from vertical observation wells. The vertical observation wells may be placed at multiple points along the length of the horizontal section of the SAGD well. These vertical observation wells provide pressure and temperature values (using multiple measurement techniques) at many points (in depth) for the SAGD well. These different temperature and pressure measurements provide complete information of temperature and pressure of steam throughout the reservoir. Further, these different temperature and pressure measurements may be used to make appropriate decisions with respect to the SAGD well as disclosed herein.

The apparatus and methods disclosed herein may provide technical solutions to technical problems related, for example, for detection and prevention of steam breakthrough associated with an SAGD well. For example, the apparatus and methods disclosed herein may control operations of an SAGD well to maintain the pressure in the producer well so that the saturation temperature corresponding to that pressure is a specified threshold lower than the temperature of the incoming fluid to prevent steam breakthrough. According to an example, the apparatus and methods disclosed herein may control operations of an SAGD well to prevent steam breakthrough by reducing the pressure difference between the injector and producer wells. According to an example, the apparatus and methods disclosed herein may control operations of an SAGD well to prevent steam breakthrough by reducing injection of steam by reducing the flow rate at the injector well top hole. According to an example, the apparatus and methods disclosed herein may control operations of an SAGD well to prevent steam breakthrough by reducing pressure at the injector well top hole. According to an example, the apparatus and methods disclosed herein may control operations of an SAGD well to prevent steam breakthrough by directing movement of the steam envelope. With respect to control of operations of an SAGD well, the apparatus and methods disclosed herein may provide for the selection and/or generation of engineering analysis models to model a physical component of the SAGD well, or the SAGD well. The engineering analysis models may emulate the associated component and/or functionality of the SAGD well to a high degree of precision based on real-time data received from the SAGD well.

FIG. 1 illustrates an environment 150 including an architecture of a steam breakthrough detection and prevention apparatus 100 (hereinafter "apparatus 100"), according to an example of the present disclosure.

Referring to FIG. 1, an engineering analysis model generator 102 may generate different types of engineering analysis models 104 with respect to steam breakthrough detection and prevention for an SAGD well 106. An engineering analysis model may be described as a digital version of physical infrastructure of the SAGD well 106. Examples of physical infrastructure include an SADG steam injector, an SADG oil producer, an oil pump, an SADG injector well, an SADG producer well, etc. An engineering analysis model identifier 108 may identify different types of engineering analysis models that are needed for analysis of the SAGD well 106 from a plurality of predetermined engineering analysis models 104. An engineering analysis model executor 110 may include a filter 112 that is applied to an associated engineering analysis model. The filter 112 may be used to direct relevant real-time data 114 from queues 116 to the engineering analysis model. The real-time data 114 may include parameter values that are associated, for example, with the engineering analysis models 104, with the SAGD well 106, etc. Examples of parameter values include pressure values, temperature values, flow rate, etc. An SAGD well controller 118 may control various operations of the SAGD well 106 to prevent the occurrence of steam breakthrough. A self-calibrator 120 may calibrate an engineering analysis model based on an analysis of a calculated output value generated by the engineering analysis model versus a corresponding actual output value. A self-learner 122 may learn appropriate procedures 124 to be applied to the SAGD well 106 to control an operation of the SAGD well 106 to prevent the occurrence of steam breakthrough. The procedures 124 may be initially determined from application of hypothetical parameter values to a simulation 132, and analysis of simulation data 134. The simulation 132 may be based on the engineering analysis models 104 of the SAGD well 106. A missing value determiner 126 may determine a missing data value in the real-time data 114 that is to be used by an engineering analysis model. An out-of-sequence value determiner 128 may determine an out-of-sequence data value in the real-time data 114 that is to be used by an engineering analysis model. A time interval-based value determiner 130 may determine a data value that is available at different time intervals in the real-time data 114.

In some examples, the elements of the apparatus 100 may be machine readable instructions stored on a non-transitory computer readable medium. In this regard, the apparatus 100 may include or be a non-transitory computer readable medium. In some examples, the elements of the apparatus 100 may be hardware or a combination of machine readable instructions and hardware.

Operation of the apparatus 100 is described with reference to FIGS. 1-19. The operations disclosed herein with respect to the various elements of the apparatus 100 may be performed by a processor (e.g., the processor 1702 of FIG. 17). For example, a processor (e.g., the processor 1702 of FIG. 17) may perform the operations disclosed herein with respect to the engineering analysis model generator 102, the engineering analysis model identifier 108, the engineering analysis model executor 110, the SAGD well controller 118, the self-calibrator 120, the self-learner 122, the missing value determiner 126, the out-of-sequence value determiner 128, and the time interval-based value determiner 130.

Figure 2:
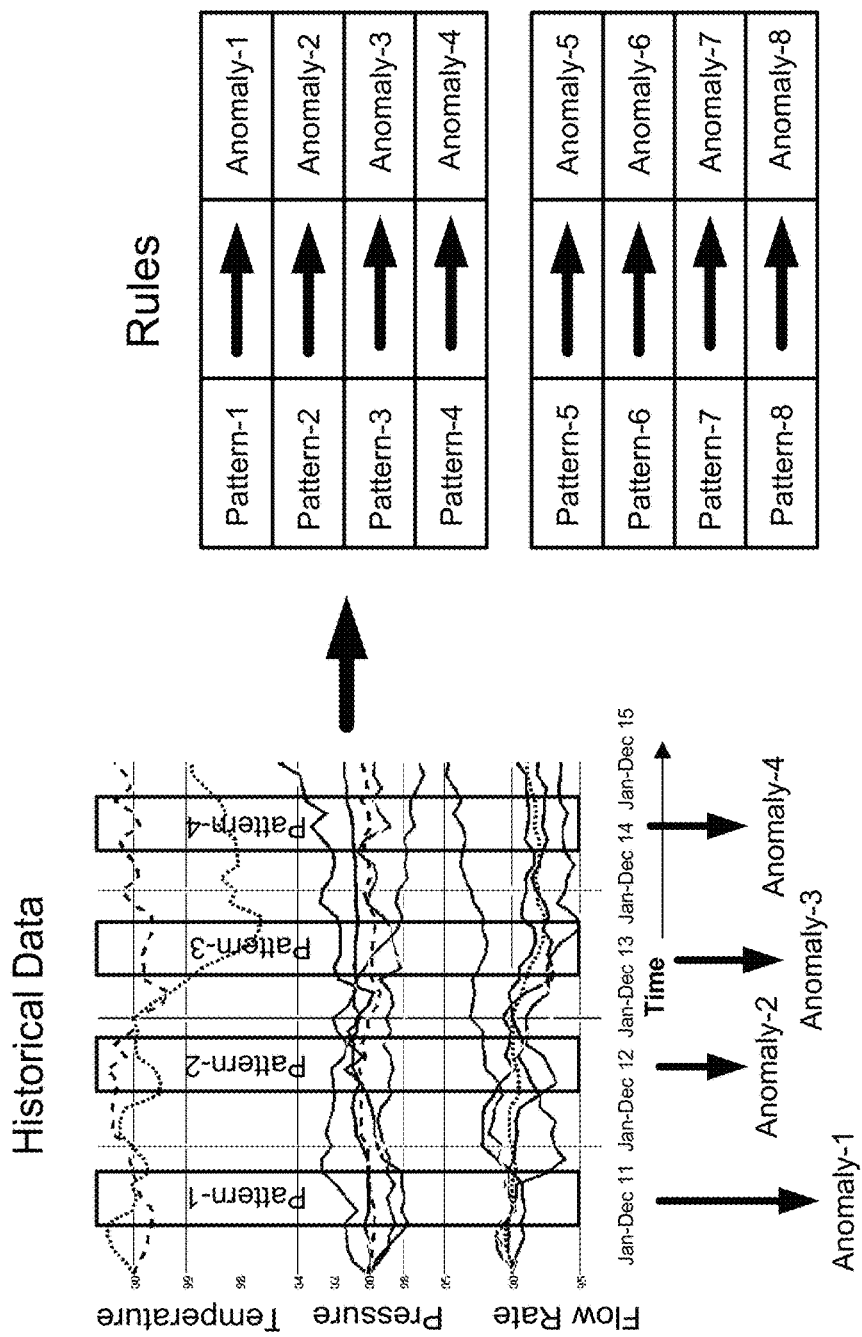
FIG. 2 illustrates anomaly prediction and remedial measure generation for the apparatus of FIG. 1, according to an example of the present disclosure.

FIG. 2 illustrates anomaly prediction and remedial measure generation for the apparatus 100, according to an example of the present disclosure. An anomaly (i.e., fault) may be described as any deviation from a specified or expected operation of the SAGD well 106. A remedial measure may be described as any procedure that is used to correct the fault and/or improve an operational performance of the SAGD well 106.

Anomalies for the SAGD well 106 may be separated into anomalies that have occurred in the past (i.e., past anomalies), and anomalies that have yet to occur (i.e., future anomalies). For example, referring to FIG. 2, historical data that may include flow rate, pressure, and temperature related to the SAGD well 106 may be used to identify anomalies 1-4 that correspond to patterns 1-4 that have occurred in the past. The apparatus 100 may generate predictions of anomalies 5-8 that correspond to patterns 5-8 that have not yet occurred in the input data. The apparatus 100 may also generate remedial measures related to the anomalies 5-8.

Figure 3:
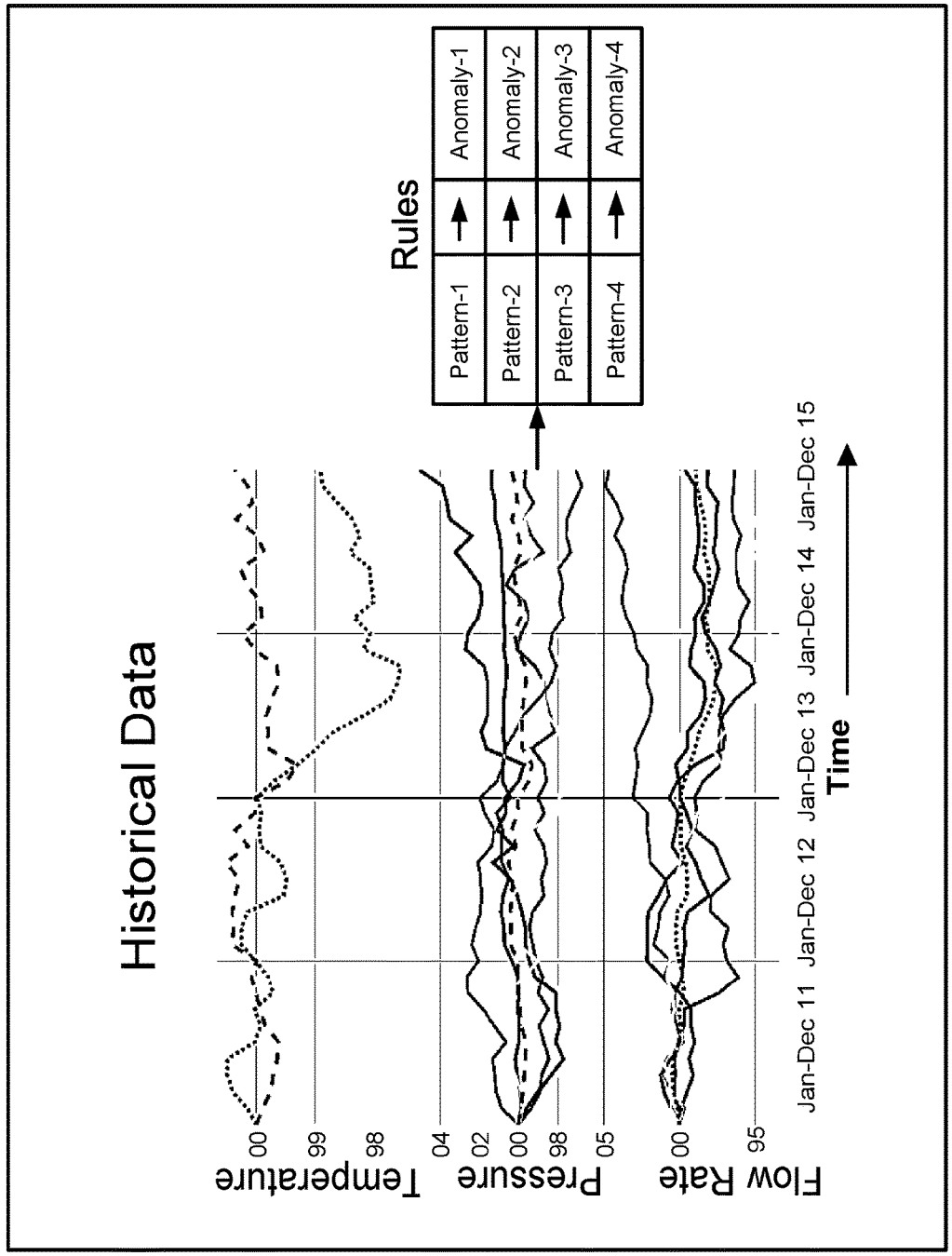
FIG. 3 illustrates application of engineering analysis models for anomaly prediction and remedial measure generation for the apparatus of FIG. 1, according to an example of the present disclosure.
Figure 3:
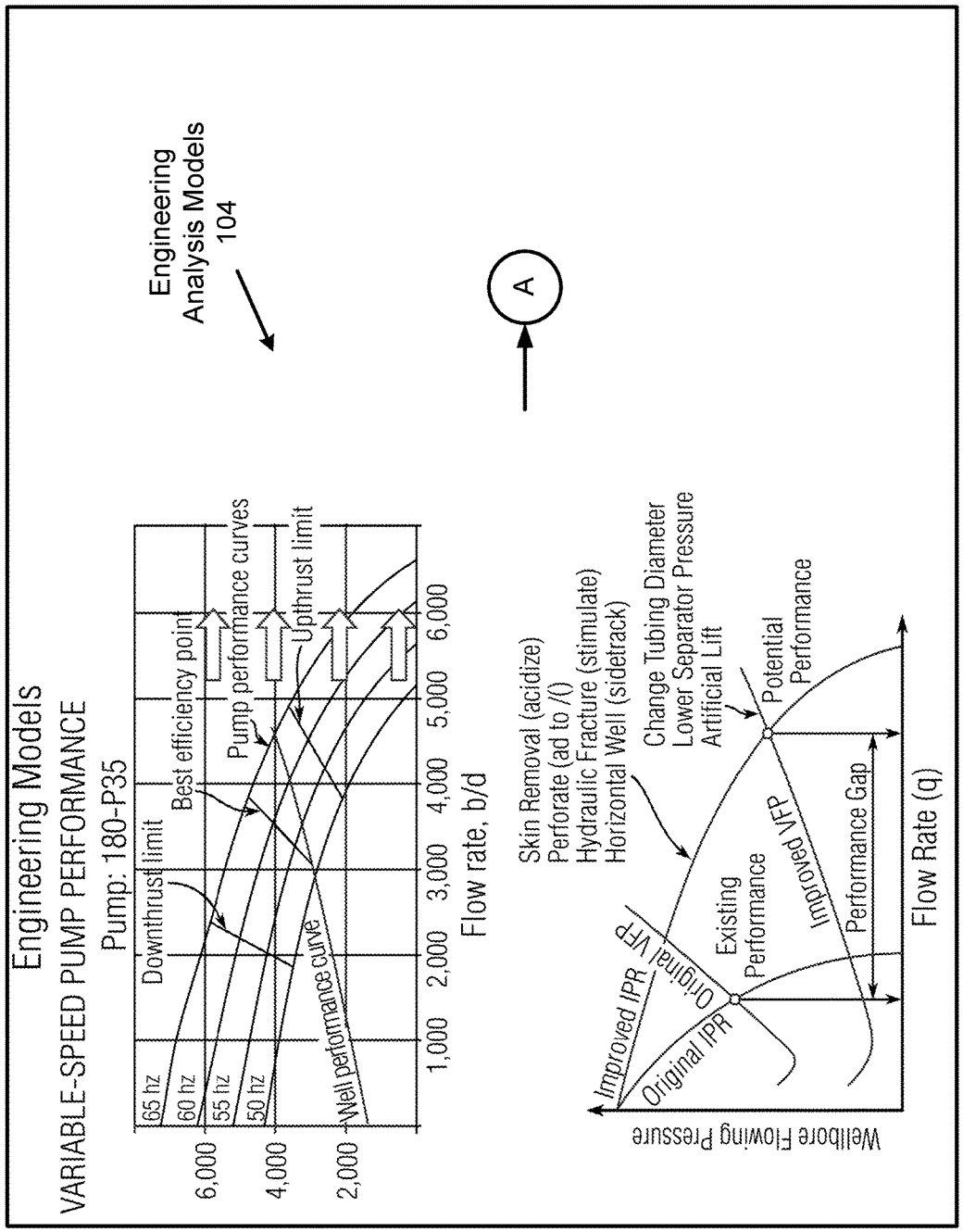
Figure 3:
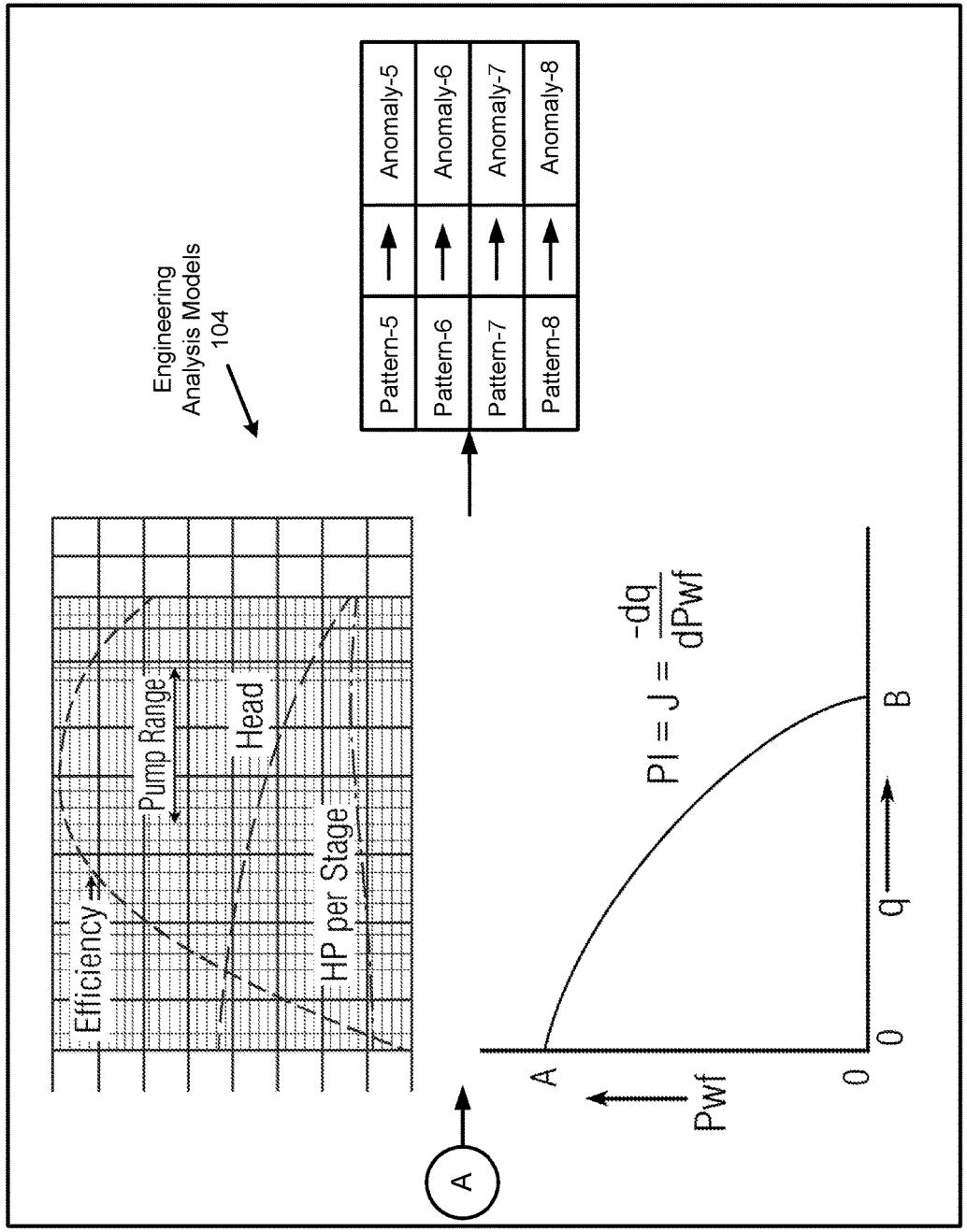

With respect to anomaly prediction and remedial measure generation, FIG. 3 illustrates application of engineering analysis models for anomaly prediction and remedial measure generation for the apparatus 100, according to an example of the present disclosure. Referring to FIGS. 1 and 3, the apparatus 100 may receive real-time data 114 from the SAGD well 106, and apply engineering analysis models 104 to generate predictions of anomalies 5-8 that correspond to patterns 5-8 that have not yet occurred in the real-time data 114. The rules/patterns related to anomalies 5-8 may be generated by simulating inputs for the engineering analysis models ahead of time. Once these rules/patterns are identified in the real-time data 114, the apparatus 100 predicts a potential anomaly from the anomalies 5-8.

Figure 4:
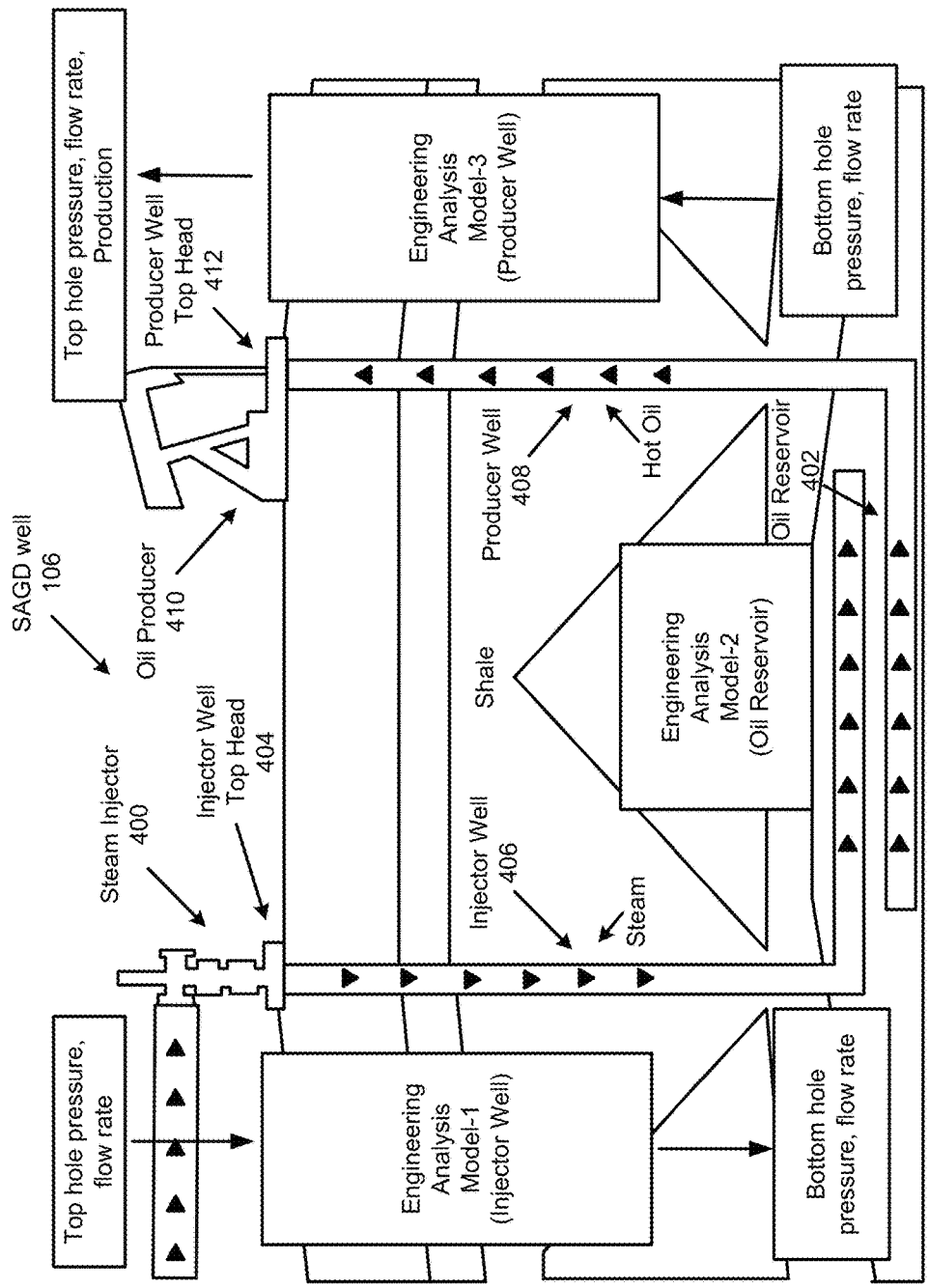
FIG. 4 illustrates steam breakthrough detection and prevention for SAGD wells, according to an example of the present disclosure.

FIG. 4 illustrates steam breakthrough detection and prevention for SAGD wells, according to an example of the present disclosure.

Referring to FIG. 4, the SAGD well 106 may include a steam injector 400 that injects high pressure steam into an oil reservoir 402. The steam may be injected via an injector well top head 404 into an injector well 406. The high pressure steam may heat the oil in the oil reservoir 402 and reduce the viscosity of the oil. The heated oil is caused to drain into the generally horizontal section of the producer well 408. At the producer well 408, the heated oil may be pumped by the oil producer 410, and removed via a producer well top head 412 to produce oil. The injector and producer wells may be disposed adjacent to each other such that the generally horizontal sections extend away from the generally vertical sections along the same direction, or opposite to each other as shown in FIG. 4.

For the injector and producer wells, a heel may be described as the location where the injector and producer wells turn from a generally vertical configuration to a generally horizontal configuration. Further, a toe may be described as the location where the injector and producer wells turn from a generally vertical configuration to a generally horizontal configuration, or alternatively, at the end-most locations of the generally horizontal sections of the injector and producer wells, depending on the reference point being used for calculations.

Referring to FIGS. 1 and 4, in order to emulate the SAGD well 106 for steam breakthrough detection and prevention, the engineering analysis model generator 102 may generate different types of engineering analysis models 104 with respect to the SAGD well 106. For example, the engineering analysis model generator 102 may generate an engineering analysis model (i.e., engineering analysis model-1) for the injector well 406. Further engineering analysis models 104 may be generated for the oil reservoir 402 (i.e., engineering analysis model-2) and the producer well 408 (i.e., engineering analysis model-3) for anomaly prediction and remedial measure determination with respect to the oil reservoir 402 and the producer well 408. In this manner, different types of engineering analysis models 104 may be generated and utilized with respect to the SAGD well 106.

The engineering analysis models 104 may also include predetermined engineering analysis models 104 that are utilized with respect to the SAGD well 106. For example, the engineering analysis model identifier 108 may identify different types of engineering analysis models that are needed for analysis of the SAGD well 106 from a plurality of predetermined engineering analysis models 104.

Figure 6:
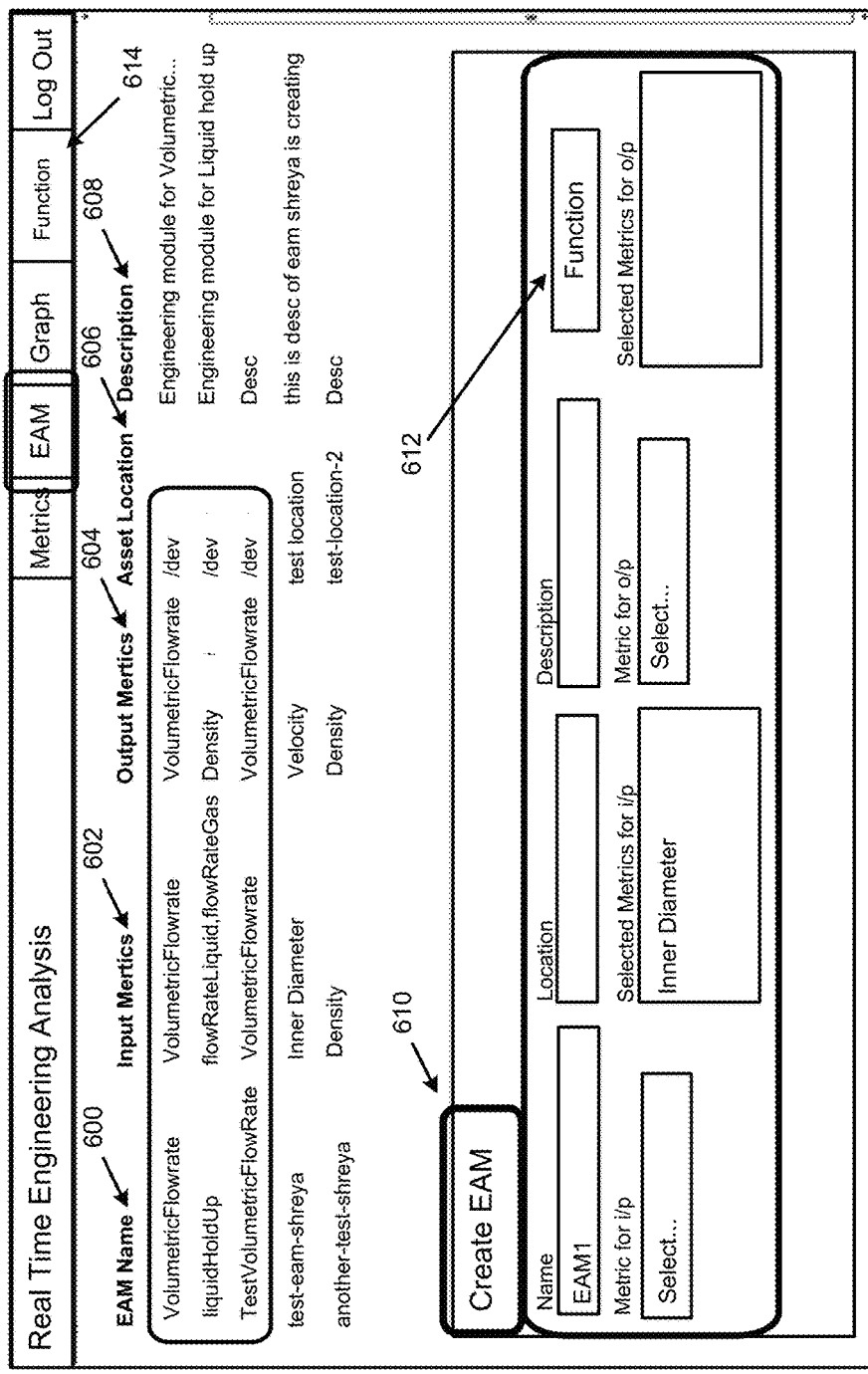
FIG. 6 illustrates generation of an engineering analysis model for the apparatus of FIG. 1, according to an example of the present disclosure.

As disclosed herein with respect to FIG. 6, the engineering analysis models 104 may be customized and/or generated by a user of the apparatus 100.

The engineering analysis model-1 for the injector well 406 may receive, as input, data such as top hole pressure and flow rate for the injector well 406, and generate, as output, bottom hole pressure and flow rate for the injector well 406. The engineering analysis model-2 for the oil reservoir 402 may receive, as input, data such as bottom hole pressure and flow rate for the injector well 406, and generate, as output, bottom hole pressure and flow rate for the producer well 408. Further, the engineering analysis model-3 for the producer well 408 may receive, as input, data such as bottom hole pressure and flow rate for the producer well 408, and generate, as output, top hole pressure, flow rate, and oil production for the producer well 408.

Figure 5:
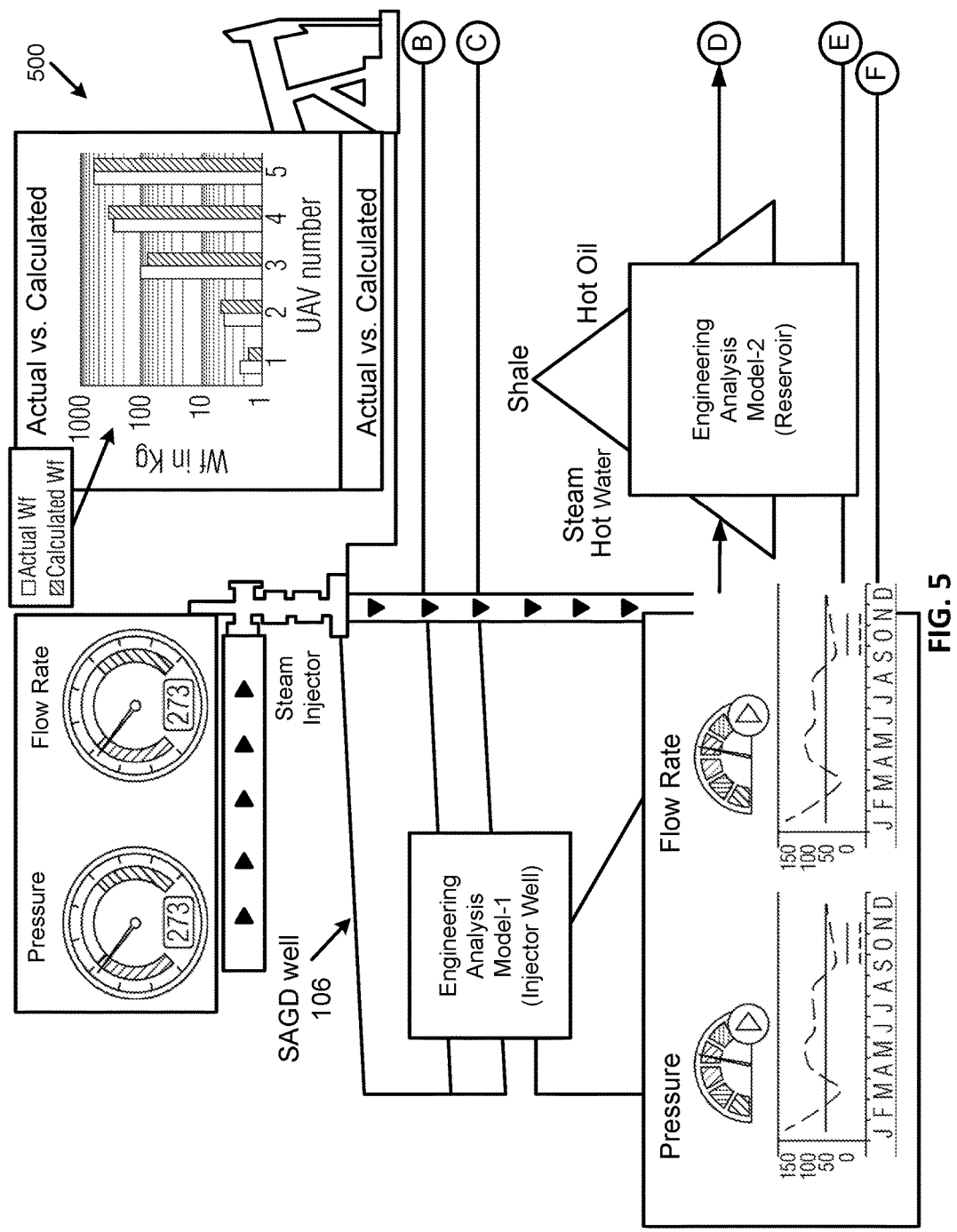
FIG. 5 illustrates further details of steam breakthrough detection and prevention for SAGD wells, according to an example of the present disclosure.
Figure 5:
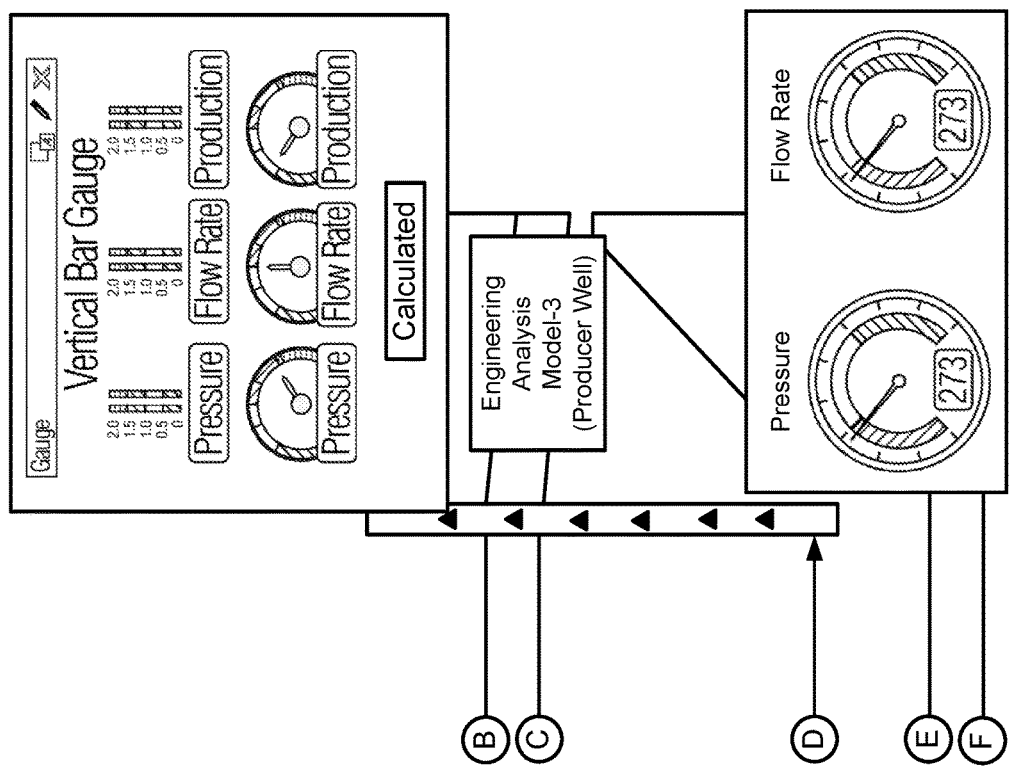

FIG. 5 illustrates further details of steam breakthrough detection and prevention for SAGD wells, according to an example of the present disclosure.

Referring to FIG. 5, with respect to the engineering analysis models 104 illustrated in FIG. 4, various types of analysis may be performed with respect to the SAGD well 106. For example, as shown at 500, the actual values of the pressure, flow rate, etc., at the bottom hole of the injector well 406 may be plotted against the calculated values at different times, where the calculated values represent values generated by the engineering analysis models 104. These actual versus calculated values may be used for self-calibration for the apparatus 100 as disclosed herein with respect to FIG. 9.

FIG. 6 illustrates generation of an engineering analysis model for the apparatus 100, according to an example of the present disclosure.

Referring to FIG. 6, a user of the apparatus 100 may customize and/or generate the engineering analysis models 104. For example, a user of the apparatus 100 may specify a name, input metrics, output metrics, location, and description of different engineering analysis models 104, respectively, at 600, 602, 604, 606, and 608. The name, input metrics, output metrics, location, and description of an engineering analysis model may be specified using a "Create EAM" option at 610, where EAM stands for engineering analysis model. Further, a function, executable code, and/or any type of analytics block associated with an engineering analysis model may be specified at 612. Details with respect to specification of the function, executable code, and/or any type of analytics block associated with an engineering analysis model may be invoked by selection of the "Function" option at 614.

Figure 7:
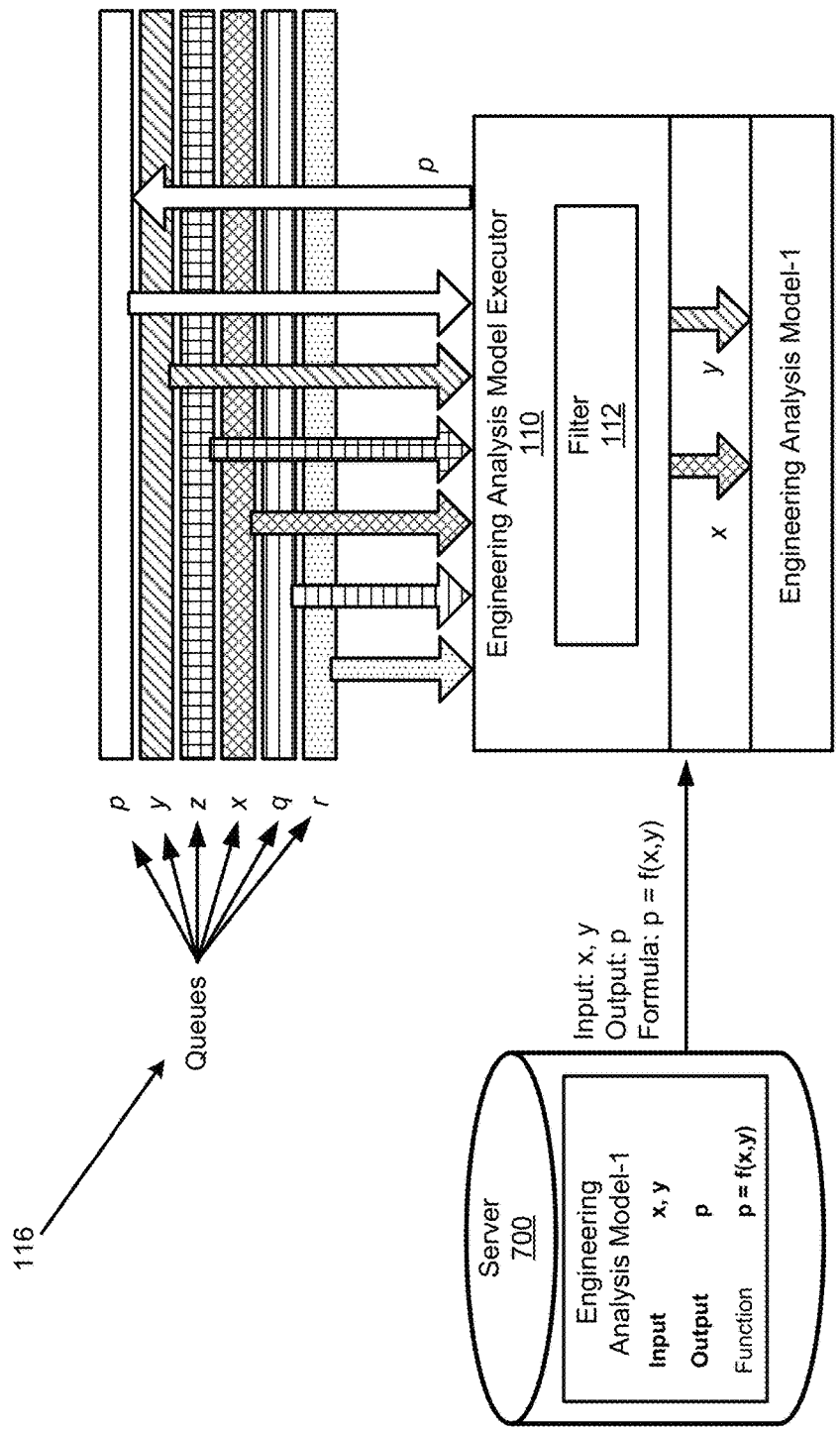
FIG. 7 illustrates execution of an engineering analysis model for the apparatus of FIG. 1, according to an example of the present disclosure.

FIG. 7 illustrates execution of an engineering analysis model for the apparatus 100, according to an example of the present disclosure.

Referring to FIG. 7, each of the engineering analysis models 104 may be stored in a server 700. According to an example, the server 700 may include a Structured Query Language (SQL) server. The engineering analysis model executor 110 may be invoked in real time to retrieve the model parameters from the server 700. Each of the engineering analysis models 104 may receive the real-time data 114 from the set of data queues 116. Alternatively or additionally, the queues 116 may include the simulation data 134, for example, for the simulation 132 of the SAGD well 106. For example, the data queues 116 may include queues for data including variables p, y, z, x, q, and r. The variables p, y, z, x, q, and r may represent parameters such as producer well top hole flow rate, injector well top hole flow rate, producer well top hole pressure, producer well bottom hole pressure, injector well top hole pressure, injector well bottom hole pressure, temperature, volume, etc., for the SAGD well 106. The parameters may be measured by using appropriate sensors implemented with the SAGD well 106, or computed by intermediary engineering analysis models, and transmitted on a real-time basis to the queues 116.

The engineering analysis model executor 110 may access (i.e., receive, or otherwise retrieve) the engineering model parameters including the filter 112 from the server 700, and the filter 112 may be applied to an associated engineering analysis model. For example, the engineering analysis model-1 may include a filter-1 (e.g., see FIG. 8) associated therewith. The filter 112 may be used to select and hence direct relevant data from the queues 116 to the appropriate engineering analysis model. For example, the filter 112 may be used to select and direct the data values x and y for the engineering analysis model-1 that uses x and y as input, and generates p as output using the function p=f(x,y) of the engineering analysis model-1. The output value of p may be returned to the queues 116 for further analysis and/or processing.

Figure 8:
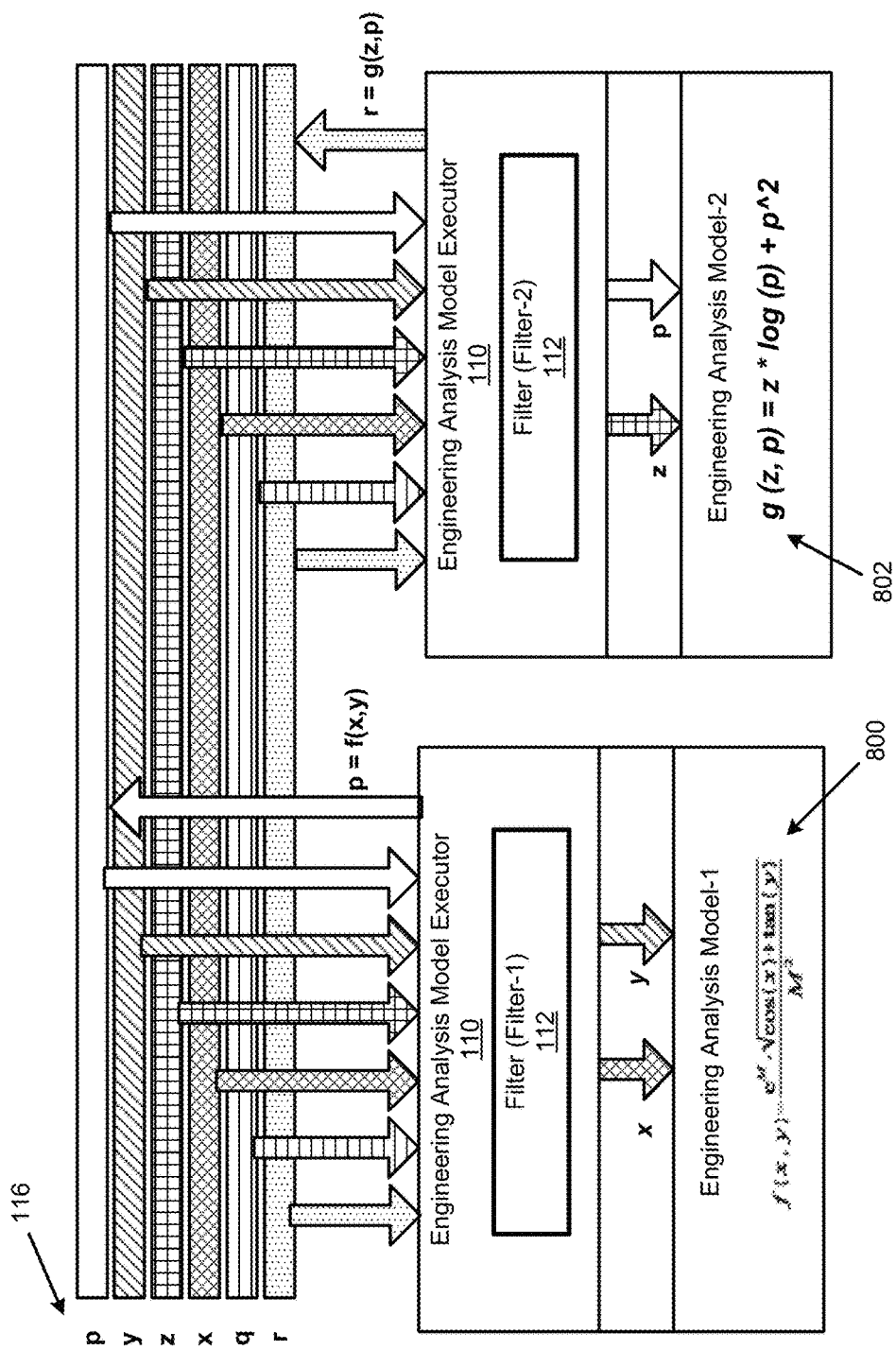
FIG. 8 illustrates composition of engineering analysis models for the apparatus of FIG. 1, according to an example of the present disclosure.

FIG. 8 illustrates composition of engineering analysis models for the apparatus 100, according to an example of the present disclosure.

As disclosed with respect to FIG. 7, the output value of p may be returned to the queues 116 for further analysis and/or processing. Referring to FIG. 8, an example of the function p=f(x,y) of the engineering analysis model-1 is shown at 800. The output value of p may be retrieved by the engineering analysis model executor 110 for execution of an engineering analysis model-2. It should be noted that the engineering analysis model executor 110 is illustrated with respect to the engineering analysis model-1 and the engineering analysis model-2 for illustrative purposes to describe execution of different engineering analysis models 104 with respect to the queues 116. With respect to the engineering analysis model-2, the engineering analysis model executor 110 may include a filter-2 associated therewith. The filter-2 may be used to direct the data values z and p for the engineering analysis model-2 that uses z and p as input, and generates r as output using the function g=(z,p) at 802. The output value of r may be returned to the queues 116 for further analysis and/or processing.

In this manner, as illustrated in FIG. 8, a plurality of engineering analysis models 104 may be executed by the engineering analysis model executor 110 using the real-time data 114 from the set of data queues 116.

Figure 9:
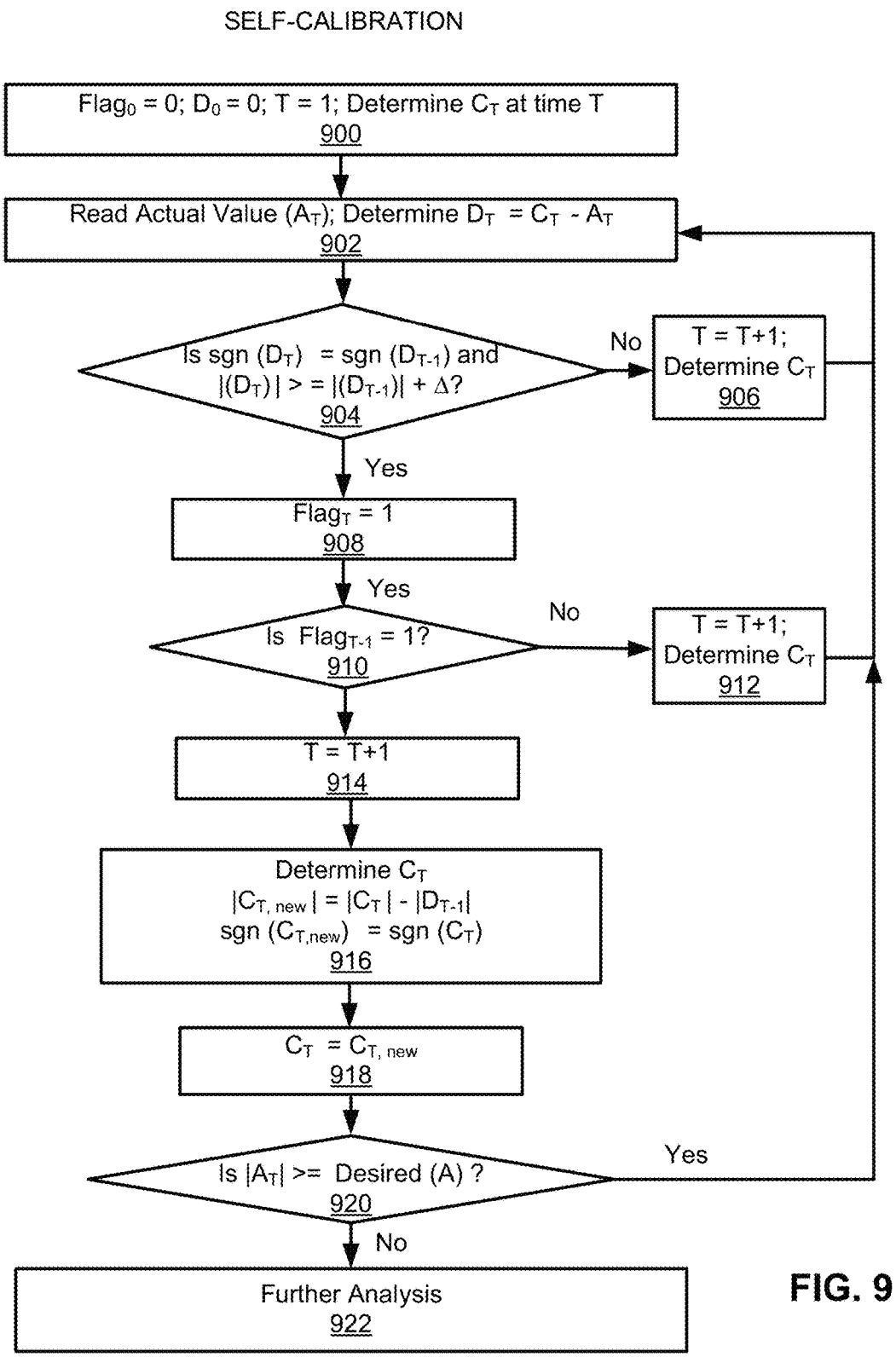
FIG. 9 illustrates a flowchart for self-calibration for the apparatus of FIG. 1, according to an example of the present disclosure.

FIG. 9 illustrates a flowchart for self-calibration for the apparatus 100, according to an example of the present disclosure.

With respect to self-calibration, the engineering analysis models 104 may be executed on a continuous basis. The engineering analysis models 104 may be used to evaluate actual versus calculated (i.e., predicted) values, for example, for parameters such as producer well top hole flow rate, injector well top hole flow rate, producer well top hole pressure, producer well bottom hole pressure, injector well top hole pressure, injector well bottom hole pressure, temperature, etc., for the SAGD well 106. For such parameters, the engineering analysis models 104 may be self-calibrated by adjusting the output of the engineering analysis models 104.

In order to calibrate the engineering analysis models 104, for each engineering analysis model, referring to FIG. 9, the self-calibrator 120 may implement the steps disclosed herein with reference to blocks 900-922. Based on the self-calibration, the engineering analysis models 104 may represent an exact replica of the associated component and/or functionality of the SAGD well 106. In this manner, the engineering analysis models 104 may emulate the associated component and/or functionality of the SAGD well 106.

At block 900, in order to determine the calculated value $C_T$ at time T, the self-calibrator 120 may set $Flag_0=0$, $D_0=0$, and T=1, where $Flag_0$ represents a status of the calibration process, and $D_0$ represents a difference between the calculated value $C_T$ and an actual value $A_T$ at time T=0 (i.e., $D_0=C_0-A_0=0$). The time T may represent an increment of time (e.g., 1 minute, 5 minutes, 10 minutes, etc.), as specified for a particular calibration analysis.

At block 902, the self-calibrator 120 may read the actual value $A_T$, and determine the difference $D_T=C_T-A_T$.

At block 904, the self-calibrator 120 may determine whether sgn $(D_T)$=sgn $(D_{T-1})$ and $|(D_T)|>=|(D_{T-1})|+\Delta$?. The "sgn" function may determine a sign value of a number such that if a sign of the number is greater than zero, then the sgn function returns 1, if the sign of the number is equal to zero, then the sgn function returns 0, and if the sign of the number is less than zero, then the sgn function returns −1. In this manner, the self-calibrator 120 may determine whether $D_T$ and $D_{T-1}$ have both increased, decreased, or stayed the same. The self-calibrator 120 may determine whether $D_T$ compared to $D_{TT}$ is consistent (e.g., consistently high or consistently low)) or inconsistent. Further, the self-calibrator 120 may determine whether a magnitude of $|(D_T)|=|(D_{T-1})|+\Delta$, where $\Delta$ represents a minimum threshold change value associated with the difference value $D_T$, and $|(D_{T-1})|$ represents the magnitude of $D_T$. If this condition is true, this indicates that the difference between the calculated and actual values has increased in two consecutive intervals by more than the threshold amount $\Delta$. The analysis at block 904 may thus determine whether the calculated value $C_T$ is to be adjusted (if sgn $(D_T)$=sgn $(D_{T-1})$ and $|(D_T)|=|(D_{T-1})|+\Delta$), or not adjusted (if sgn $(D_T)$ # sgn $(D_{T-1})$, or $|(D_T)|<|(D_{T-1})|+\Delta$).

In response to a determination at block 904 that sgn $(D_T)\neq$sgn $(D_{T-1})$, or $|(D_T)|<|(D_{T-1})|+\Delta$, at block 906, the self-calibrator 120 may set T=T+1, and determine $C_T$ for T=T+1. Further processing may revert to block 902.

In response to a determination at block 904 that sgn $(D_T)$=sgn $(D_{T-1})$ and $|(D_T)|>=|(D_{T-1})|+\Delta$, at block 908, the self-calibrator 120 may set Flag$_T$=1.

At block 910, the self-calibrator 120 may determine whether Flag$_{T-1}$=1. When both Flag$_T$ and Flag$_{T-1}$ are 1, it indicates that the difference between the calculated and actual values has increased consistently (in back to back intervals), and hence it is likely a trend that needs to be corrected. On the other hand, if Flag$_T$ and Flag$_{T-1}$ are different (0 and 1), it indicates that the difference between the calculated and actual values has not increased consistently (in back to back intervals) and hence it is likely an issue that does not need to be corrected. In this manner, the self-calibrator 120 may determine whether an adjustment to the calculated value $C_T$ was made at a previous iteration so that the calculated value $C_T$ is not adjusted at every iteration of the self-calibration flow.

In response to a determination at block 910 that Flag$_{T-1}\neq$1, at block 912, the self-calibrator 120 may set T=T+1, and determine $C_T$ for T=T+1. Further processing may revert to block 902.

In response to a determination at block 910 that Flag$_{T-1}$=1, at block 914, the self-calibrator 120 may set T=T+1.

At block 916, the self-calibrator 120 may determine $C_T$ by determining $|C_{T,new}|=|C_T|-|D_{T-1}|$, and specifying sgn $(C_{T,new})$=sgn $(C_T)$.

At block 918, the self-calibrator 120 may specify $C_T=C_{T,new}$.

At block 920, the self-calibrator 120 may determine whether $|A_T|>=$Desired (A). That is, the self-calibrator 120 may determine whether the magnitude of that actual value that is read at block 902 is greater than or equal to the desired value of A (which is calculated by the engineering analysis model). Alternatively, the evaluation at block 920 may be set such that the self-calibrator 120 determines whether $|A_T|<=$Desired (A), depending on the requirements of the particular engineering analysis model. For example, for an evaluation at block 920 of $|A_T|<=$Desired (A), A may represent a maximum value of a parameter such as temperature for the SAGD well 106. Alternatively, for an evaluation at block 920 of $|A_T|>=$Desired (A), A may represent a minimum value of parameters such as producer well top hole flow rate, injector well top hole flow rate, producer well top hole pressure, producer well bottom hole pressure, injector well top hole pressure, injector well bottom hole pressure, etc.

In response to a determination at block 920 that $|A_T|>=$Desired (A) (or $|A_T|<=$Desired (A) as disclosed with respect to block 920), processing may revert to block 902.

In response to a determination at block 920 that $|A_T|<$Desired (A) (or $|A_T|>$Desired (A) as disclosed with respect to block 920), at block 922, the SAGD well 106 and/or the equipment related to the SAGD well 106 may be subject to further analysis. That is, if the magnitude of the actual value no longer meets the requirements for the parameter associated with the value, then the SAGD well 106 and/or the equipment related to the SAGD well 106 may no longer meet the minimum or maximum requirements for the parameter associated with the value. The parameter associated with the value may include, for example, producer well top hole flow rate, injector well top hole flow rate, producer well top hole pressure, producer well bottom hole pressure, injector well top hole pressure, injector well bottom hole pressure, temperature, etc., for the SAGD well 106.

Figure 10:
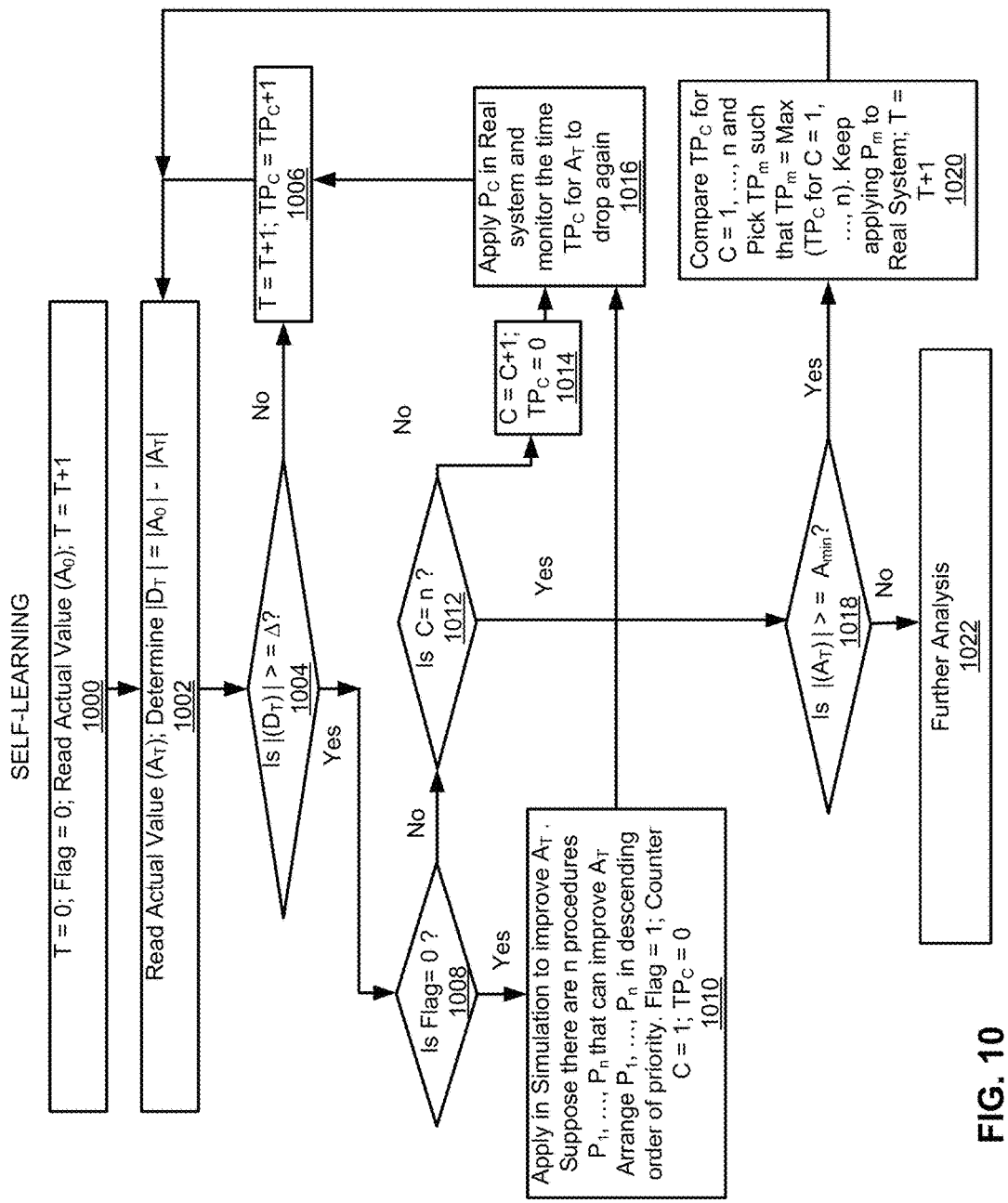
FIG. 10 illustrates a flowchart for self-learning for the apparatus of FIG. 1, according to an example of the present disclosure.

FIG. 10 illustrates a flowchart for self-learning for the apparatus 100, according to an example of the present disclosure.

With respect to self-learning, assuming that in order to prevent steam breakthrough, a procedure $P_1$ includes reducing a flow rate at a producer well top hole, a procedure $P_2$ includes reducing a flow rate at an injector well top hole, etc., up to procedures $P_n$, self-learning may be implemented by the self-learner 122 to apply an appropriate procedure from the procedures $P_1$ to $P_n$ to the SAGD well 106. For example, assuming that of the procedures $P_1$ to $P_n$, the procedure $P_2$, which includes reducing a flow rate at an injector well top hole results in steam breakthrough prevention under a given set of circumstances as disclosed herein, is a highest priority procedure for steam breakthrough prevention, then the procedure $P_2$ may be implemented before any of the other procedures are implemented for steam breakthrough prevention under the given set of circumstances associated with the SAGD well 106. In this regard, self-learning may be implemented by the self-learner 122 to determine a priority order of procedures for steam breakthrough prevention under different sets of circumstances associated with the SAGD well 106. Further, self-learning may account for changes in the operation of the SAGD well 106 over time. For example, self-learning may account for changes in the oil reservoir. As disclosed herein, the self-learning may be used to determine a procedure from a plurality of procedures that provides, for example, a highest improvement in the operation of the SAGD well 106.

Referring to FIG. 10, at block 1000, with respect to self-learning, the self-learner 122 may set T=0, and Flag=0, read the actual value $(A_0)$, and set T=T+1, where Flag represents a status of the self-learning process, and $A_0$ represents the actual value $A_T$ at time T=0. With respect to steam breakthrough, $A_0$ may represent a maximum (or minimum based on the parameter being evaluated, with the flow of FIG. 10 being modified accordingly) pressure or flow rate at a specified location of the SAGD well 106.

At block 1002, the self-learner 122 may read the actual value $(A_T)$, and determine $|D_T|=|A_0|-|A_T|$, where $D_T$ represents a difference between the actual value $(A_0)$ and the actual value $(A_T)$, and $|D_T|$ represents the magnitude of $D_T$.

At block 1004, the self-learner 122 may determine whether $|(D_T)|>=\Delta$, where $\Delta$ represents the minimum threshold change value associated with the difference value $D_T$.

In response to a determination at block 1004 that $|(D_T)|<\Delta$, at block 1006 the self-learner 122 may set T=T+1, and TP$_C$=TP$_C$+1, where TP$_C$ represents a time value associated with P$_C$, and P$_C$ represents a procedure that is applied to the SAGD well 106.

In response to a determination at block 1004 that $|(D_T)|>=\Delta$, at block 1008 the self-learner 122 may determine if Flag=0. Flag=0 indicates that no procedure has been applied thus far.

In response to a determination at block 1008 that Flag=0, at block 1010, different procedures may be applied in the simulation 132 of the SAGD well 106 to improve $A_T$. The simulation 132 may be based on the engineering analysis models 104 for the SAGD well 106. For example, suppose there are n procedures $P_1, \ldots, P_n$ that can improve $A_T$, the self-learner 122 may arrange the procedures $P_1, \ldots, P_n$ in descending order of priority such that the best procedure to improve $A_T$ is designated the highest priority procedure. The procedures $P_1, \ldots, P_n$ may include pre-determined procedures that have been applied to SAGD wells and/or hypothetical procedures that have yet to be applied to SAGD wells, including the SAGD well 106. Further, the self-learner 122 may set Flag=1, a counter C=1, and $TP_C$=0. $TP_C$ may represent the time for the actual value $A_T$ to drop. The counter C keeps track of the number of procedures that have been already tried. Thus C=n indicates that all n procedures have already been tried out.

According to an example, the self-learning as disclosed herein with respect to FIG. 10 may be implemented in sequence after implementation of self-calibration as disclosed herein with respect to FIG. 9. In this regard, once the apparatus 100 is calibrated so that the output of the engineering analysis models 104 matches the actual output associated with the SAGD well 106, the procedures $P_1, \ldots, P_n$ may be used to accurately predict behavior of the SAGD well 106.

In response to a determination at block 1008 that Flag≠0, at block 1012 the self-learner 122 may determine if C=n, where n represents the number of procedures at block 1010.

In response to a determination at block 1012 that C≠n, at block 1014 the self-learner 122 may set C=C+1, and $TP_C$=0. C≠n indicates there are procedures that have not yet been applied. $TP_C$ may track the time duration (i.e., interval) for which procedure $P_C$ has been effective in maintaining the value of parameter A at the desired level. That is, the greater is the value of $TP_C$, the more effective is the procedure.

At block 1016 the self-learner 122 may apply procedure $P_C$ to the SAGD well 106 and monitor the time $TP_C$ for $A_T$ to drop again (or rise depending on the specifics of the $A_T$, for example, where $A_T$ represents a pressure that may drop or rise depending on whether the procedure $P_C$ is expected to respectively increase or reduce the pressure). For example, because the oil reservoir 402 as shown in FIG. 4 includes heterogeneous properties, a procedure $P_C$ may yield different results for $A_T$ as time progresses after the initial application of the procedure $P_C$. Further processing from block 1016 may revert to block 1006. The application of the procedures $P_1, \ldots, P_n$ to the SAGD well 106 may be used to verify whether the priority order as determined by application of the procedures $P_1, \ldots, P_n$ to the simulation 132 of the SAGD well 106 at block 1010 is accurate.

At block 1018 the self-learner 122 may determine if $|(A_T)|>=A_{min}$, where $A_{min}$ represents a minimum value of the actual value.

In response to a determination at block 1018 that $|(A_T)|>=A_{min}$, at block 1020 the self-learner 122 may compare $TP_C$ for C=1, \ldots, n and select $TP_m$ such that $TP_m$=Max ($TP_C$ for C=1, \ldots, n). In this regard, the self-learner 122 selects the procedure from the procedures applied to the SAGD well 106 that results in the highest improvement of $A_T$ for the longest time. Further, the self-learner 122 may continue to apply procedure $P_m$ to the actual SAGD well 106, and set T=T+1.

In response to a determination at block 1018 that $|(A_T)|<A_{min}$ (or $|(A_T)|>A_{min}$ in a similar manner as discussed with respect to blocks 920 and 922), at block 1022, the SAGD well 106 and/or the equipment related to the SAGD well 106 may be subject to further analysis. That is, if the magnitude of the actual value no longer meets the requirements for the parameter associated with the value, then the SAGD well 106 and/or the equipment related to the SAGD well 106 may no longer meet the minimum or maximum requirements for the parameter associated with the value. For example, the oil reservoir 402 of the SAGD well 106 may no longer include the needed oil reserves to meet the minimum or maximum requirements for the parameter associated with the value.

Figure 11:
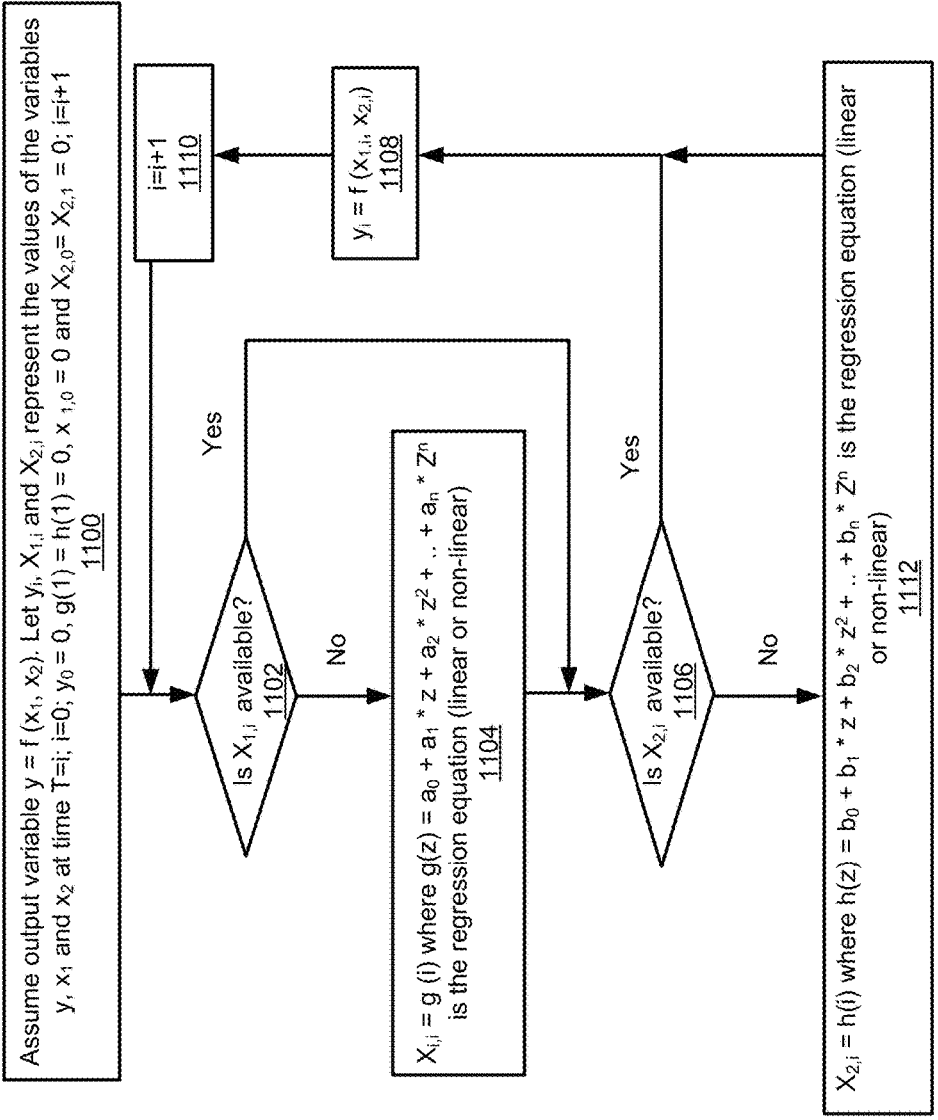
FIG. 11 illustrates a flowchart for determination of a missing value for the apparatus of FIG. 1, according to an example of the present disclosure.

FIG. 11 illustrates a flowchart for determination of a missing value for the apparatus 100, according to an example of the present disclosure.

With respect to missing value determination, referring to FIG. 7, in order to evaluate the function p=f(x,y) (or another function such as y=f ($x_1, x_2, \ldots, x_n$)), the engineering analysis model-1 may retrieve the latest data values x and y. Assuming that the data value x or the data value y is missing, referring to FIG. 11, at block 1100, the missing value determiner 126 may determine a missing value (e.g., x or y) as follows. Assuming an output variable y=f($x_1, x_2$), the missing value determiner 126 may set $X_{1,i}$ and $X_{2,i}$ to represent the values of the variables y, $x_1$ and $x_2$ at time T=i; i=0; $y_0$=0, g(1)=h(1)=0, $x_{1,0}$=0 and $X_{2,0}$=$X_{2,1}$=0; i=i+1, where y represents an output variable for a function to be performed by an engineering analysis model, and $x_1$ and $x_2$ represent data values that are needed to perform the function to determine y.

At block 1102, the missing value determiner 126 may determine if a value $X_{1,i}$ is available.

In response to a determination at block 1102 that the value $X_{1,i}$ is not available, at block 1104, the missing value determiner 126 may set $X_{i,i}$=g where g(z)=$a_0$+$a_1$*z+$a_2$*$z^2$+ \ldots +$a_n$*$Z^n$ is the regression equation (linear or non-linear). Thus, the missing value determiner 126 may interpolate the value $X_{1,i}$ based on the regression equation (linear or non-linear).

At block 1106, the missing value determiner 126 may determine if a value $X_{2,i}$ is available. Further, with respect to block 1102, in response to a determination at block 1102 that the value $X_{1,i}$ is available, processing may proceed directly to block 1106.

In response to a determination at block 1106 that the value $X_{2,i}$ is available, at block 1108, the missing value determiner 126 may set $y_i$=f($x_{1,i}, x_{2,i}$).

At block 1110, the missing value determiner 126 may increment i=i+1, with processing being reverted to block 1102, to ensure that all values for y are continuously determined.

In response to a determination at block 1106 that the value $X_{2,i}$ is not available, at block 1112, the missing value determiner 126 may set $X_{2,i}$=h(i), where h(z)=$b_0$+$b_1$*z+$b_2$*$z^2$+ \ldots +$b_n$*$Z^n$ is the regression equation (linear or non-linear). Further processing may revert to block 1108. Thus, the missing value determiner 126 may interpolate the value $X_{2,i}$ based on the regression equation (linear or non-linear).

With respect to missing value determination, for p=f($x_1, x_2, \ldots, x_n$), additional regression equations (linear or non-linear) may be added in a similar manner as disclosed herein with respect to blocks 1104 and 1110, for determination of any missing data values beyond $x_1$ and $x_2$.

Figure 12:
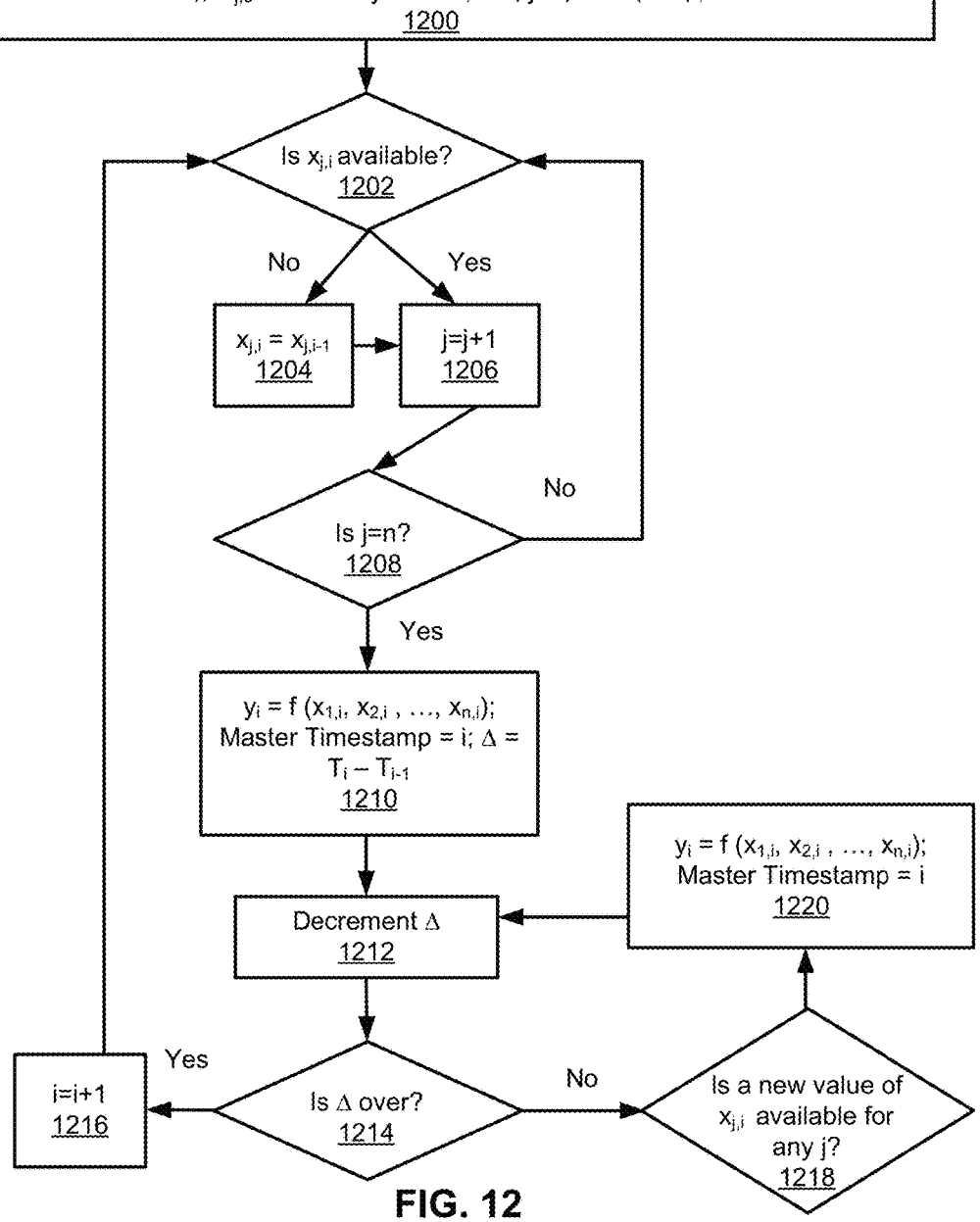
FIG. 12 illustrates a flowchart for determination of an out-of-sequence value for the apparatus of FIG. 1, according to an example of the present disclosure.

FIG. 12 illustrates a flowchart for determination of an out-of-sequence value for the apparatus 100, according to an example of the present disclosure.

With respect to determination of an out-of-sequence value, referring to FIG. 7, in order to evaluate the function p=f(x,y) (or another function such as y=f($x_1$, $x_2$, ..., $x_n$)), the determination of an out-of-sequence value may be applied to a case where a data value is received at a later time compared to when the data value is supposed to be available.

Referring to FIG. 12, at block 1200, with respect to out-of-sequence value determination, the out-of-sequence value determiner 128 may determine an out-of-sequence value as follows. Assuming an output variable y=f($x_1$, $x_2$, ..., $x_n$), where y represents an output variable for a function to be performed by an engineering analysis model, and $x_1$, $x_2$, ..., $x_n$ represent data values that are needed to perform the function to determine y, the out-of-sequence value determiner 128 may set $y_i$, $x_{1,i}$, $x_{2,i}$, ..., $x_{n,i}$ to represent the values of the variables y, $x_1$, $x_2$, ..., $x_n$ at time T=i. If a timestamp t corresponding to the value of a variable $x_m$ is between T=i and T=i+1, then the out-of-sequence value determiner 128 may determine that the variable $x_m$ is the value of $x_{m,i}$, where $y_0$=0, $x_{j,0}$=0 for all j=1 ... n; I=1; j=1; $\Delta = T_i - T_{i-1}$.

At block 1202, the out-of-sequence value determiner 128 may determine if $x_{j,i}$ is available.

In response to a determination at block 1202 that $x_{j,i}$ is not available, at block 1204 the out-of-sequence value determiner 128 may set $x_{j,i} = x_{j,i-1}$. Thus, at block 1202, $x_{j,i}$ may be set to the previous value $x_{j,i-1}$.

In response to a determination at block 1202 that $x_{j,i}$ is available, at block 1206 the out-of-sequence value determiner 128 may set j=j+1.

At block 1208, the out-of-sequence value determiner 128 may determine if j=n. That is, the out-of-sequence value determiner 128 may determine if all values for $x_1$, $x_2$, ..., $x_n$ are analyzed.

In response to a determination at block 1208 that j≠n, further processing may revert to block 1202 until j=n (i.e., all of the $x_{j,i}$ values are analyzed at block 1202).

In response to a determination at block 1208 that j=n, at block 1210 the out-of-sequence value determiner 128 may set $y_i$=f($x_{1,i}$, $x_{2,i}$, ..., $x_{n,i}$), a master Timestamp=i, and $\Delta = T_i - T_{i-1}$. At block 1210, A may represent the time difference that is used to wait to determine whether a missing value is available. If the out-of-sequence value determiner 128 sets $x_{j,i} = x_{j,i-1}$ at block 1204, then at block 1210, $y_i$=f($x_{1,i}$, $x_{2,i}$, ..., $x_{n,i}$) is based on $x_{j,i}$ as set at block 1204.

At block 1212, the out-of-sequence value determiner 128 may decrement $\Delta$. For example, $\Delta$ may be decremented by increments of $(T_i - T_{i-1})/4$.

At block 1214, the out-of-sequence value determiner 128 may determine if $\Delta$ is over.

In response to a determination at block 1214 that $\Delta$ is over, at block 1216 the out-of-sequence value determiner 128 may increment i=i+1, with further processing reverting to block 1202.

In response to a determination at block 1214 that $\Delta$ is not over, at block 1218 the out-of-sequence value determiner 128 may determine if a new value of $x_{j,i}$ is available for any j. That is, the out-of-sequence value determiner 128 may determine whether the missing value of $x_{j,i}$ from block 1202 is available.

At block 1220, the out-of-sequence value determiner 128 may set $y_i$=f ($x_{1,i}$, $x_{2,i}$, ..., $x_{n,i}$), and set the master Timestamp=i. That is, if a new value of $x_{j,i}$ is available at block 1218, that value may be used for $y_i$, and otherwise, $y_i$ remains the same as specified at block 1210.

Figure 13:
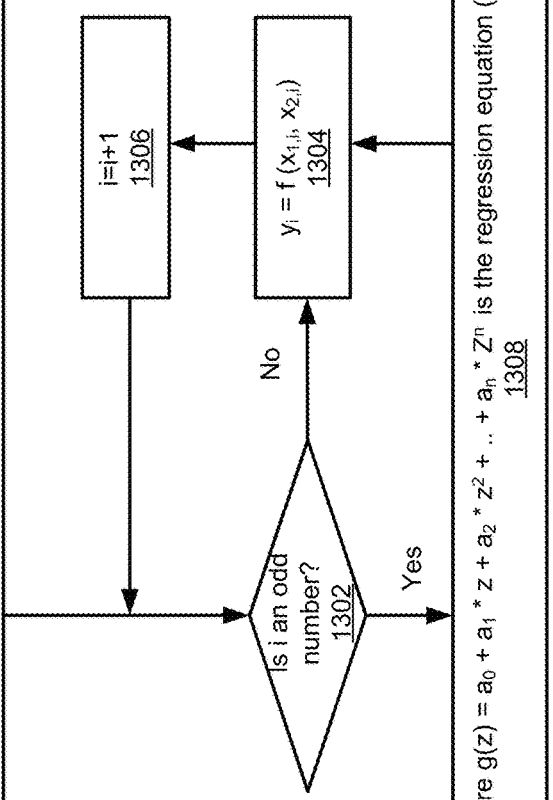
FIG. 13 illustrates a flowchart for determination of values that arrive at different time intervals for the apparatus of FIG. 1, according to an example of the present disclosure.

FIG. 13 illustrates a flowchart for determination of values that arrive at different time intervals for the apparatus 100, according to an example of the present disclosure.

Referring to FIG. 13, at block 1300, with respect to determination of values that arrive at different time intervals, the time interval-based value determiner 130 may determine a value that arrives at a different time interval as follows. Assuming an output variable y=f($x_1$, $x_2$), the time interval-based value determiner 130 may set $y_i$, $x_{1,i}$, and $X_{2,i}$ to represent the values of the variables y, $x_1$, and $x_2$ at time T=i. The time interval-based value determiner 130 may sample $x_{1,i}$ for every i, and $X_{2,i}$ for every alternate i (i.e., every 2×i). Further, the time interval-based value determiner 130 may set i=0; $y_0$=0, g(1)=0, $x_{1,0}$=0 and $X_{2,0} = X_{2,1}$=0; i=i+1.

At block 1302, the time interval-based value determiner 130 may determine if i is an odd number.

In response to a determination at block 1302 that i is not an odd number, at block 1304 the time interval-based value determiner 130 may set $y_i$=f($x_{1,i}$, $x_{2,1}$).

At block 1306, the time interval-based value determiner 130 may set i=i+1, and further processing may revert to block 1302.

In response to a determination at block 1302 that i is an odd number, at block 1308 the time interval-based value determiner 130 may set $X_{2,i}$=g(i), where $g(z) = a_0 + a_1 * z + a_2 * z^2 + ... + a_n * Z^n$ is the regression equation (linear or non-linear). That is, because the value of $X_{2,i}$ is only available every alternate i, the regression equation (linear or non-linear) may be used to determine the value of $X_{2,i}$ that is not available.

Figure 14:
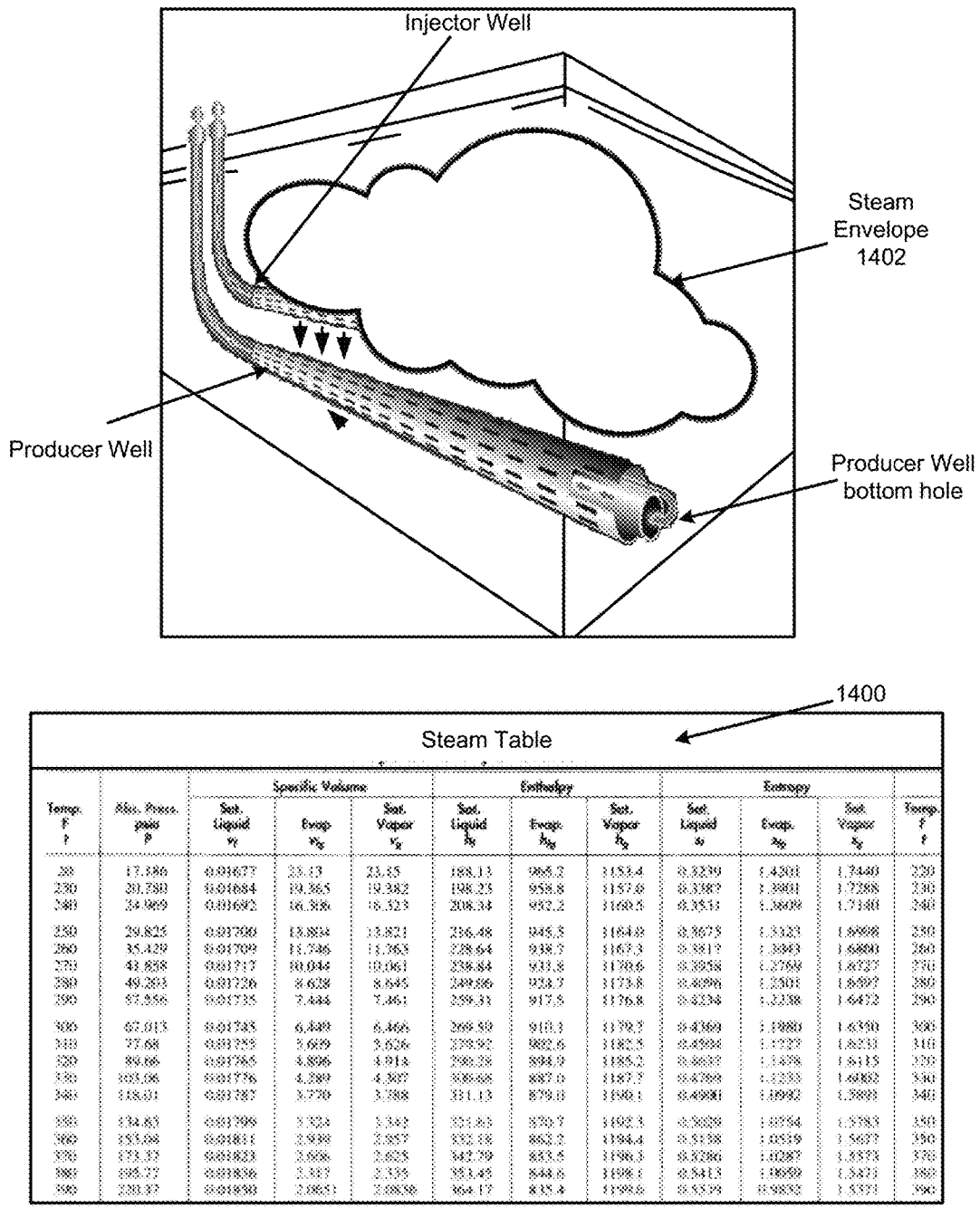
FIG. 14 illustrates steam chamber expansion and contraction with respect to operation of the apparatus of FIG. 1 for steam breakthrough detection and prevention for SAGD wells, according to an example of the present disclosure.

FIG. 14 illustrates steam chamber expansion and contraction with respect to operation of the apparatus 100 for steam breakthrough detection and prevention for SAGD wells, according to an example of the present disclosure.

Referring to FIGS. 4 and 14, in order to detect steam breakthrough for the SAGD well 106, for example, based on the producer well bottom hole pressure, the saturation temperature corresponding to the producer well bottom hole pressure may be determined, for example, from a steam table at 1400. For example, assuming that approximately 175° C. (347° F.) represents the saturation temperature for steam, if the temperature of the steam is lower than approximately 175° C., the steam will condense to water. Otherwise, if the temperature of the steam is greater than or equal to approximately 175° C., the steam will remain as vapor. Based on the sensing of temperature along the length of the producer well 408, if the temperature at the producer well bottom hole is higher than the saturation temperature for steam (e.g., approximately 175° C.), steam breakthrough is likely to occur. For the generally horizontal portions of the producer and injector wells, if a steam envelope 1402 is within approximately 1-2 meters of the producer well (which is disposed approximately 4-5 meters from the injector well), steam breakthrough is likely to occur.

Figure 15:
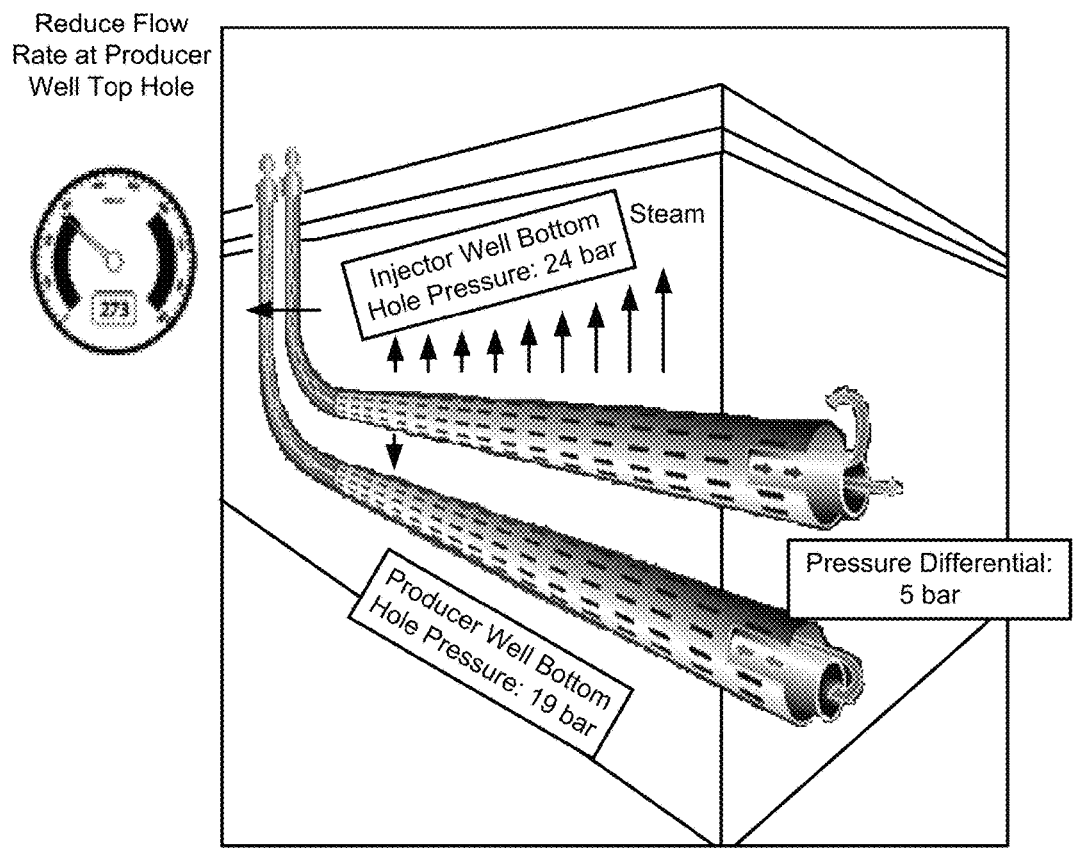
FIG. 15 illustrates operation of the apparatus of FIG. 1 for steam breakthrough detection and prevention for SAGD wells, according to an example of the present disclosure.

FIG. 15 illustrates operation of the apparatus 100 for steam breakthrough detection and prevention for SAGD wells, according to an example of the present disclosure.

Referring to FIGS. 1, 4, 9, 10, and 15, the SAGD well controller 118 may control operations of the SAGD well 106 to eliminate the draw of steam into the producer well, which requires the pressure difference to be reduced between the injection and producer wells. For example, if the injector well bottom hole pressure is approximately 24 bar and the producer well bottom hole pressure is approximately 19 bar, then the producer well 408 will likely draw steam along with fluid. That is, assuming that a pressure differential threshold of 4 bar, then the pressure difference of 5 bar between the injector well bottom hole pressure and the producer well bottom hole pressure will likely result in draw steam along with fluid. Thus, the SAGD well controller 118 may control operations of the SAGD well 106 to reduce the pressure differential, and hence to eliminate the draw of steam along with fluid. As disclosed herein with reference to FIG. 10, with respect to self-learning, one procedure of reducing the pressure differential may include reducing the producer well top hole flow rate. Another procedure of reducing the pressure differential may include increasing the producer well top hole pressure. Assuming that the self-learner 122 determines that reducing the producer well top hole flow rate is a higher ranked procedure to be applied for reducing the pressure differential, the SAGD well controller 118 may control operations of the SAGD well 106 to reduce the producer well top hole flow rate, so that the producer well bottom hole pressure will increase, for example, to 22 bar, to thus reduce the pressure differential, and hence eliminate the draw of steam along with fluid. In this regard, engineering analysis models for the injector well 406 and/or the producer well 408 may be applied to model the injector and/or producer wells. Further, with respect to reduction of the producer well top hole flow rate, the self-calibration as described herein with respect to FIG. 9 may be applied to ensure that the calculated values with respect to flow rate are indeed accurate.

As disclosed herein, the apparatus 100 receives the real-time data 114 and the simulation data 134. The real-time data 114 may be received from the SAGD well 106 and applied in the engineering analysis models 104 to predict an output of the SAGD well 106. The output may be predicted on a continuous basis. Over time, as the actual value of the output of the SAGD well 106 departs from the predicted value, the SAGD well controller 118 generates an indication that some input parameter is to be changed. Based on this indication, the simulation 132 may be used, for example, by an operator of the SAGD well 106 to test different hypothetical parameter values. For example, referring to FIG. 14, the hypothetical parameter values may include different producer well top hole flow rates. As disclosed herein with respect to block 1010 of FIG. 10, the hypothetical parameter values may be applied to the simulation 132 (which includes the same engineering analysis models 104), with an associated procedure, to determine the impact of the hypothetical values. This process may be conducted off-line. Once a determination is made that the hypothetical parameter values are acceptable, as disclosed herein with respect to block 1016 of FIG. 10, the best hypothetical parameter (and its associated procedure) that results in the desired operation of the SAGD well 106 may be applied to the SAGD well 106. The simulation 132 may also be performed as part of the apparatus 100, where hypothetical parameter values may be applied to the simulation 132, with ideal parameter values being selected accordingly, and the selected ideal parameter values being applied to the SAGD well 106.

Referring to FIGS. 1-3, 10, and 15, the SAGD well controller 118 may generate predictions of anomalies 5-8 that correspond to patterns 5-8 that have not yet occurred in the input data. In this regard, a first step may include using the simulation 132 of the SAGD well 106 as disclosed herein with respect to block 1010 to also derive rules corresponding to the anomalies 5-8. The derivation of the rules may be performed offline. For example, a rule may indicate that reducing the producer well top hole flow rate will result in a reduced pressure differential. Thus, generally, a rule may be used to indicate how a parameter or another attribute of the SAGD well 106 impacts the performance of the system 106. With respect to a determination of a potential anomaly with respect to prevention of steam breakthrough, the real-time data 114 from the SAGD well 106 may be used to check against the rules to predict if any anomaly may occur. The self-learner 122 may generate remedial measures related to the anomalies 5-8. In this regard, the SAGD well controller 118 may receive the real-time data 114 from the SAGD well 106, and apply engineering analysis models 104 to generate predictions of anomalies 5-8 that correspond to patterns 5-8 that have not yet occurred in the real-time data 114. For example, with respect to the example of FIG. 15, assuming that the pattern that results in the draw of steam into the producer well (e.g., anomaly-5) has not yet occurred in the real-time data 114, but the data pattern in the real-time data 114 matches the rules that predict a potential anomaly, the self-learner 122 may generate and analyze various procedures as disclosed herein with respect to blocks 1010, 1016, and 1020 of FIG. 10, to address the associated anomaly. The highest ranked procedure may include reducing the producer well top hole flow rate to prevent the draw of steam into the producer well.

Figure 16:
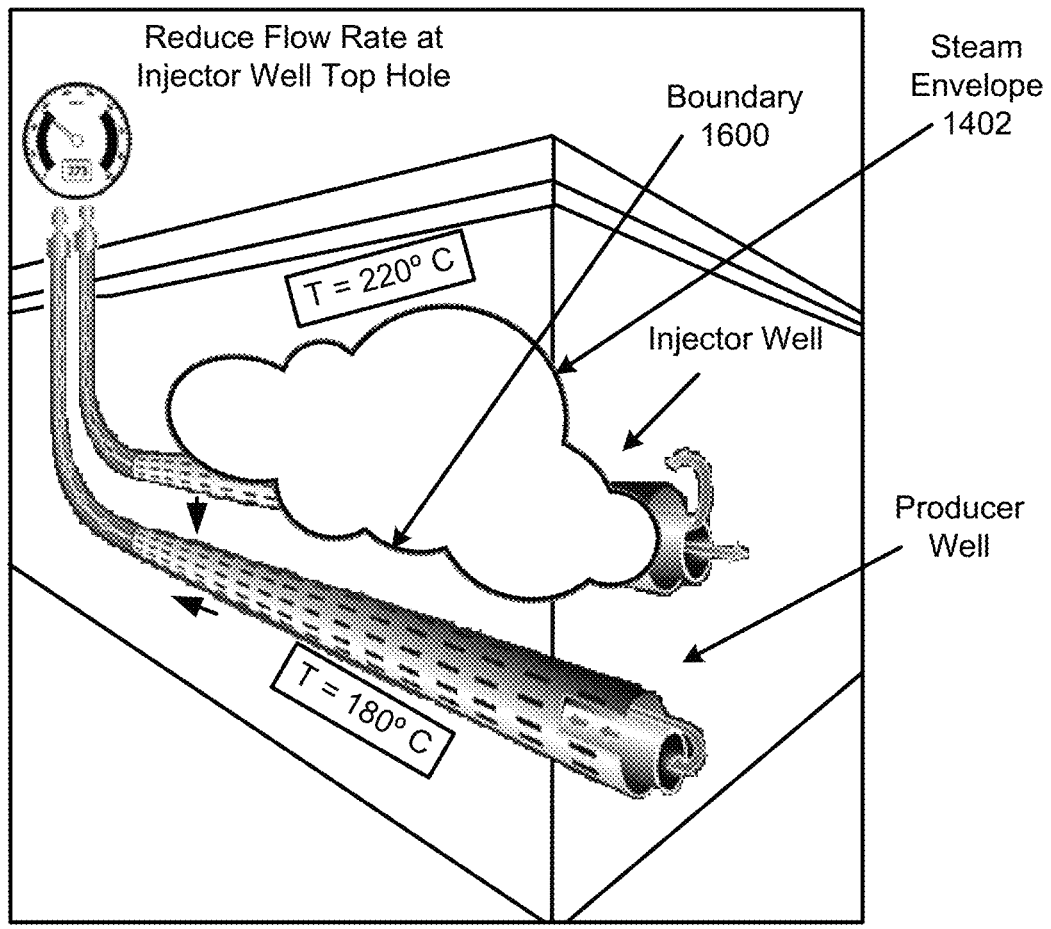
FIG. 16 illustrates further details of operation of the apparatus of FIG. 1 for steam breakthrough detection and prevention for SAGD wells, according to an example of the present disclosure.

FIG. 16 illustrates further details of operation of the apparatus 100 for steam breakthrough detection and prevention for SAGD wells, according to an example of the present disclosure.

Referring to FIG. 16, as disclosed herein, with respect to prevention of steam breakthrough, sub-cool may be described as the difference between the saturation temperature of water at the producer well pressure and the actual temperature of water at the same place where the pressure is measured. A higher liquid level above the producer well corresponds to a lower temperature and a higher sub-cool.

Referring to FIGS. 1, 4, 9, 10, and 16, in order to prevent steam breakthrough, the SAGD well controller 118 may control operations of the SAGD well 106 to reduce an injection well top hole flow rate. For example, referring to FIG. 16, assuming that steam temperature for the injector well 406 is 220° C., a saturation temperature at a boundary 1600 of the steam envelope 1402 is 190° C., and a temperature at the producer well 408 is 150° C., the difference between saturation temperature at the boundary 1600 and the producer well temperature of 150° C. equates to a sub-cool temperature of 40° C. If the steam envelope 1402 expands, and the producer well temperature increases to 180° C., the sub-cool temperature reduces to 10° C. (i.e., 190° C.–180° C.). In this regard, assuming that a minimum sub-cool temperature is specified at 15° C., the SAGD well controller 118 may determine that steam breakthrough is likely to occur. In order to increase the sub-cool temperature, as disclosed herein with reference to FIG. 10, with respect to self-learning, assuming that the highest priority procedure for increasing the sub-cool temperature is to reduce the injection well top hole flow rate, the SAGD well controller 118 may control operations of the SAGD well 106 to reduce the injection well top hole flow rate, to thus increase the sub-cool temperature to greater than 15° C. In this regard, engineering analysis models for the injector well 406 and/or the producer well 408 may be applied to model the injector and/or producer wells. Further, with respect to reduction of the injection well top hole flow rate, the self-calibration as disclosed herein with respect to FIG. 9 may be applied to ensure that the calculated values with respect to flow rate are indeed accurate.

Referring to FIGS. 1, 4, and 16, according to another example with respect to sub-cool, in order to prevent steam breakthrough, the SAGD well controller 118 may control operations of the SAGD well 106 to maintain the pressure in the producer well 408 so that the saturation temperature corresponding to that pressure is approximately 5-20° lower (i.e., sub-cool) than the temperature of the incoming fluid.

For example, if the temperature of incoming water is approximately 225° (which corresponds to approximately 25 bar for saturation) and the pressure in the producer well 408 in 26 bar, the pressure of the producer well 408 should be reduced to at least approximately 25 bar. However, as an added precaution, the SAGD well controller 118 may implement the further reduction of the producer well bottom hole pressure, for example, by reducing the producer well top hole pressure, such that the saturation temperature is approximately 215° (i.e., 15° sub-cool). Thus, the SAGD well controller 118 may control operations of the SAGD well 106 to ensure that the steam condenses to water before it enters the producer well 408, or the moment the steam enters the producer well 408.

A variety of techniques may be used to control operations of an SAGD well to prevent steam breakthrough as disclosed herein. For example, in addition to the techniques disclosed herein, steam may be injected selectively or produced from certain intervals using inflow/outflow control devices (ICDs). An example of an ICD may include a nozzle, an expanding/collapsing packer, a valve, etc. If an SAGD well is equipped with these devices, the SAGD well controller 118 may control such devices for optimum interval selection for injection/production to not only direct steam towards the right areas, but also produce more from areas where there is more liquid pool. The more liquid that is remaining in the reservoir, the more heat is needed to keep the steam mobile, hence resulting in inefficient operation. This would be well equipment/ICD/flow-control-device manipulation to balance the steam chamber along the length of the wellbore and produce more of the mobile fluid out.

Figure 17:
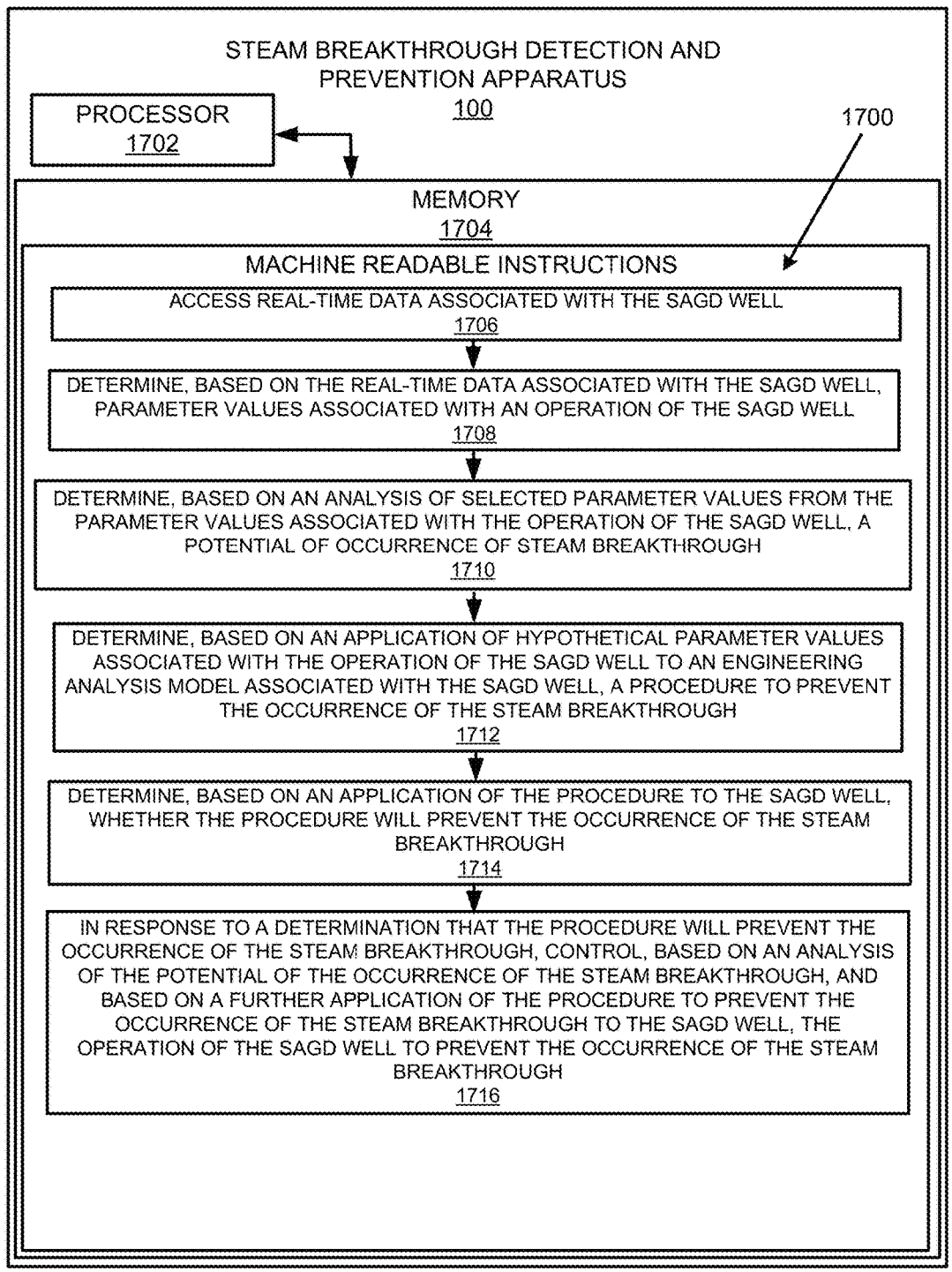
FIG. 17 illustrates a flowchart of a method for steam breakthrough detection and prevention, according to an example of the present disclosure.
Figure 18:
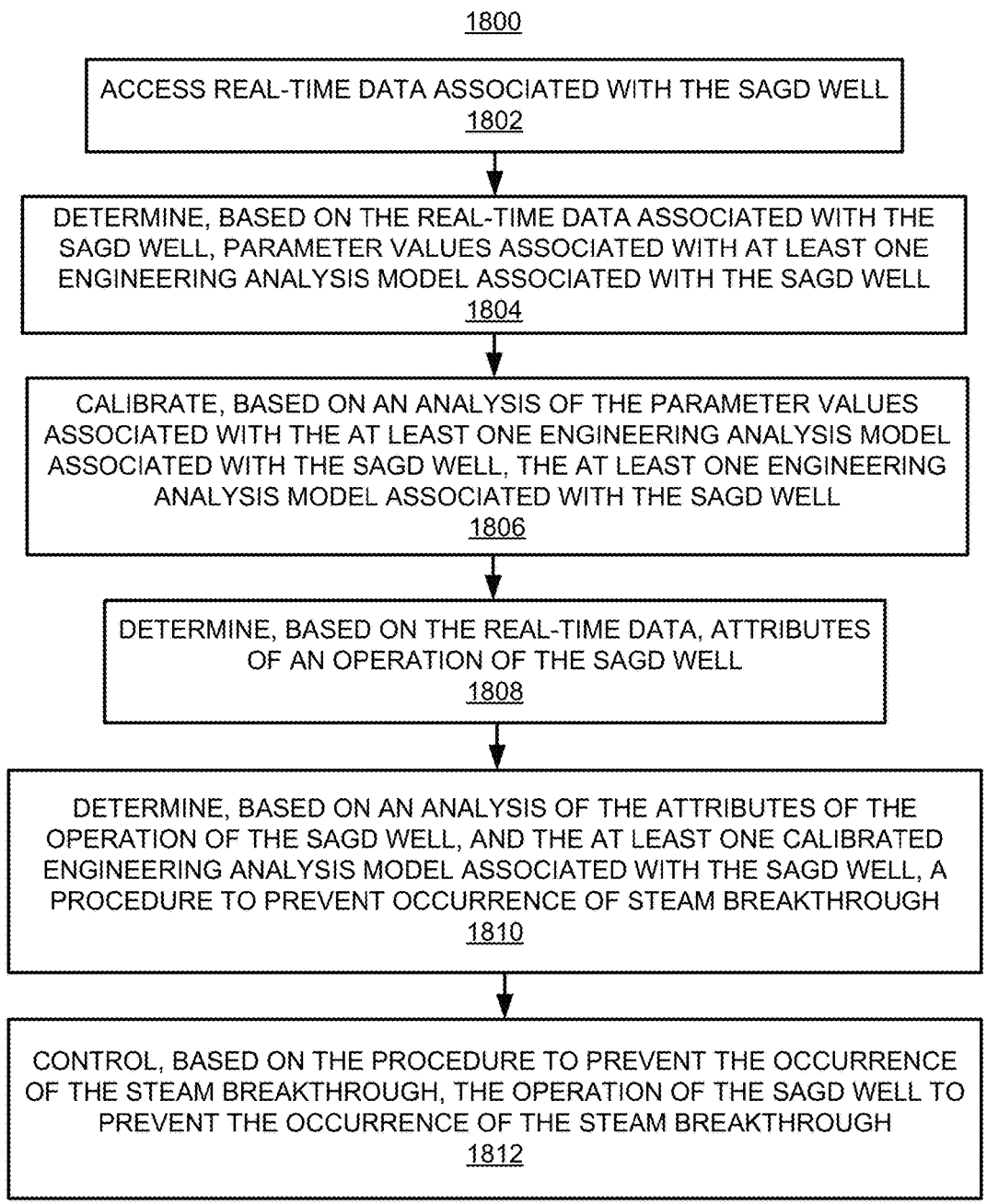
FIG. 18 illustrates a flowchart of another method for steam breakthrough detection and prevention, according to an example of the present disclosure.
Figure 19:
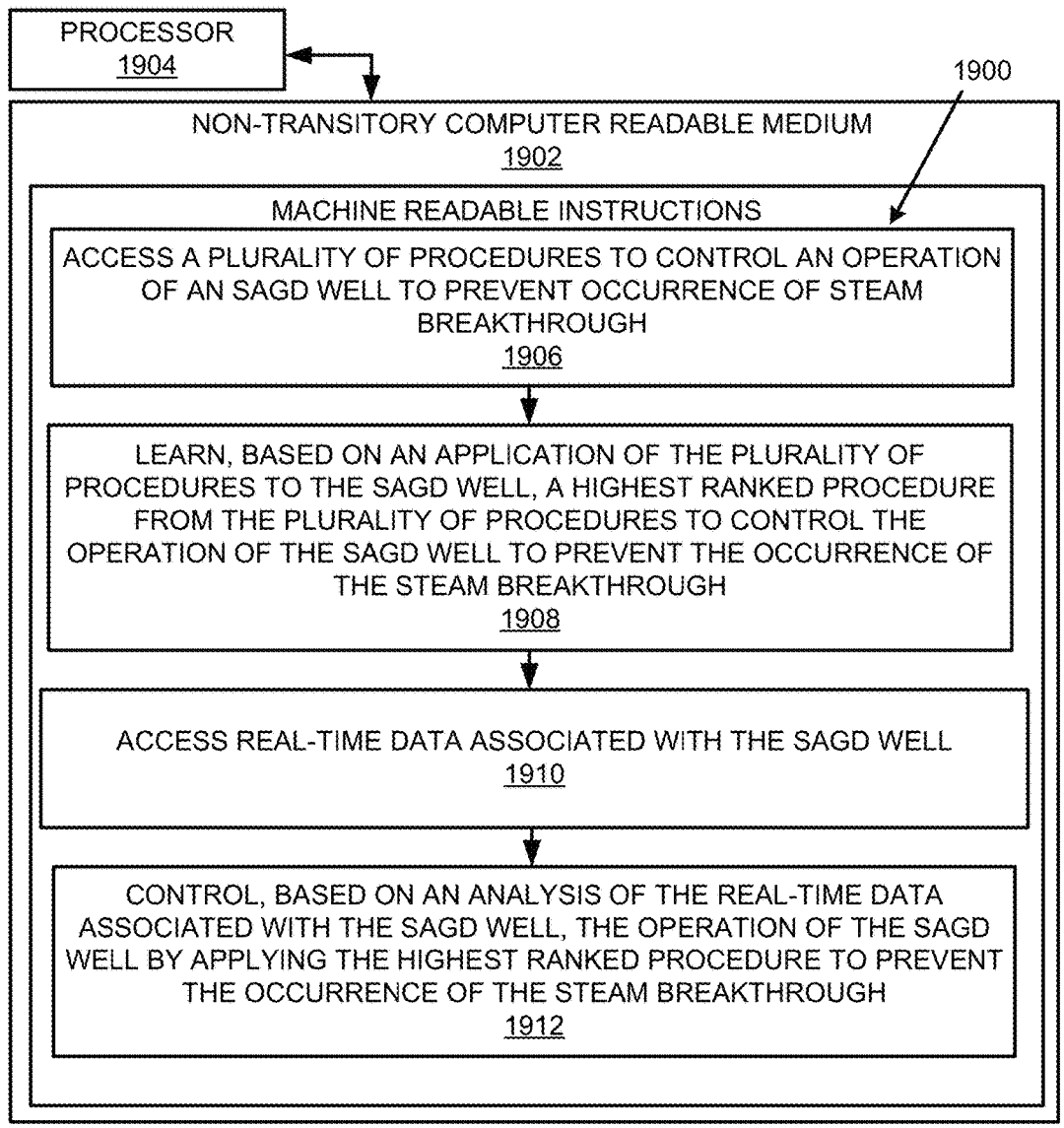
FIG. 19 illustrates a flowchart of a further method for steam breakthrough detection and prevention, according to an example of the present disclosure.

FIGS. 17-19 respectively illustrate flowcharts of methods 1700, 1800, and 1900 for steam breakthrough detection and prevention, according to examples. The methods 1700, 1800, and 1900 may be implemented on the apparatus 100 described above with reference to FIGS. 1-16 by way of example and not limitation. The methods 1700, 1800, and 1900 may be practiced in other apparatus. In addition to showing the method 1700, FIG. 17 shows hardware of the apparatus 100 that may execute the method 1700. The hardware may include a processor 1702, and a memory 1704 storing machine readable instructions that when executed by the processor cause the processor to perform the steps of the method 1700. The memory 1704 may represent a non-transitory computer readable medium. FIG. 18 may represent a method for steam breakthrough detection and prevention, and the steps of the method. FIG. 19 may represent a non-transitory computer readable medium 1902 having stored thereon machine readable instructions to provide steam breakthrough detection and prevention. The machine readable instructions, when executed, cause a processor 1904 to perform steps of the method 1900 also shown in FIG. 19.

The processor 1702 of FIG. 17 and/or the processor 1904 of FIG. 19 may include a single or multiple processors or other hardware processing circuit, to execute the methods, functions and other processes described herein. These methods, functions and other processes may be embodied as machine readable instructions stored on a computer readable medium, which may be non-transitory (e.g., the memory 1704 of FIG. 17, and the non-transitory computer readable medium 1902 of FIG. 19), such as hardware storage devices (e.g., RAM (random access memory), ROM (read only memory), EPROM (erasable, programmable ROM), EEPROM (electrically erasable, programmable ROM), hard drives, and flash memory). The memory 1704 may include a RAM, where the machine readable instructions and data for the processor 1702 may reside during runtime.

Referring to FIGS. 1-17, and particularly to the method 1700 shown in FIG. 17, at block 1706, the method 1700 may include accessing (e.g., by the SAGD well controller 118) real-time data 114 associated with the SAGD well 106. The real-time data may be collected from a plurality of components and/or a plurality of locations of the SAGD well 106.

At block 1708, the method 1700 may include determining (e.g., by the SAGD well controller 118), based on the real-time data 114 associated with the SAGD well 106, parameter values associated with an operation of the SAGD well 106. Examples of parameter values may include producer well top hole flow rate, injector well top hole flow rate, producer well top hole pressure, producer well bottom hole pressure, injector well top hole pressure, injector well bottom hole pressure, temperature, etc. An operation of the SAGD well may include steam injection, oil removal, etc., or a combination of different operations.

At block 1710, the method 1700 may include determining (e.g., by the SAGD well controller 118), based on an analysis of selected parameter values from the parameter values associated with the operation of the SAGD well 106, a potential of occurrence of steam breakthrough. For example, as disclosed herein with respect to FIGS. 14-16, the SAGD well controller 118 may analyze various parameter values to determine a potential of occurrence of steam breakthrough. Moreover, the selected parameter values may include all or some of the parameter values associated with the operation of the SAGD well 106.

At block 1712, the method 1700 may include determining, based on an application of hypothetical parameter values associated with the operation of the SAGD well 106 to an engineering analysis model associated with the SAGD well 106, a procedure to prevent the occurrence of the steam breakthrough. For example, as disclosed herein with respect to FIGS. 9 and 10, the SAGD well controller 118 may operate in conjunction with the self-calibrator 120 and the self-learner 122 to determine a procedure to prevent the occurrence of the steam breakthrough.

At block 1714, the method 1700 may include determining (e.g., by the SAGD well controller 118), based on an application of the procedure to the SAGD well 106, whether the procedure will prevent the occurrence of the steam breakthrough.

At block 1716, in response to a determination that the procedure will prevent the occurrence of the steam breakthrough, the method 1700 may include controlling (e.g., by the SAGD well controller 118), based on an analysis of the potential of the occurrence of the steam breakthrough, and based on a further application of the procedure to prevent the occurrence of the steam breakthrough to the SAGD well 106, the operation of the SAGD well 106 to prevent the occurrence of the steam breakthrough. For example, as disclosed herein with respect to FIGS. 14-16, the SAGD well controller 118 may control the operation of the SAGD well 106 to prevent the occurrence of the steam breakthrough.

According to examples, for the method 1700, as disclosed herein with respect to FIG. 15, determining, based on the analysis of selected parameter values from the parameter values associated with the operation of the SAGD well 106, the potential of the occurrence of the steam breakthrough may further include determining an injector well bottom hole pressure for the injector well bottom hole, determining a producer well bottom hole pressure for the producer well bottom hole, and determine a difference between the injector well bottom hole pressure and the producer well bottom hole pressure. In response to a determination that the difference is less than a pressure differential threshold, the method 1700 may include determining the potential of the occurrence of the steam breakthrough.

According to examples, for the method 1700, as disclosed herein with respect to FIG. 15, determining, based on the application of the hypothetical parameter values associated with the operation of the SAGD well 106 to the engineering analysis model associated with the SAGD well 106, the procedure to prevent the occurrence of the steam breakthrough may further include determining, based on the application of the hypothetical parameter values associated with the operation of the SAGD well 106 to the engineering analysis model associated with the SAGD well 106, the procedure that includes reducing a flow rate at the producer well top head 412 to prevent the occurrence of the steam breakthrough.

According to examples, for the method 1700, as disclosed herein with respect to FIG. 15, determining, based on the application of the hypothetical parameter values associated with the operation of the SAGD well 106 to the engineering analysis model associated with the SAGD well 106, the procedure to prevent the occurrence of the steam breakthrough may further include determining, based on the application of the hypothetical parameter values associated with the operation of the SAGD well 106 to the engineering analysis model associated with the SAGD well 106, the procedure that includes increasing a pressure at the producer well top head 412 to prevent the occurrence of the steam breakthrough.

According to examples, for the method 1700, as disclosed herein with respect to FIG. 15, determining, based on the application of the hypothetical parameter values associated with the operation of the SAGD well 106 to the engineering analysis model associated with the SAGD well 106, the procedure to prevent the occurrence of the steam breakthrough may further include determining, based on the application of the hypothetical parameter values associated with the operation of the SAGD well 106 to the engineering analysis model associated with the SAGD well 106, the procedure that includes manipulating a flow rate at the producer well and a pressure at the injector well to prevent the occurrence of the steam breakthrough.

According to examples, for the method 1700, as disclosed herein with respect to FIG. 16, determining, based on the analysis of selected parameter values from the parameter values associated with the operation of the SAGD well 106, the potential of the occurrence of the steam breakthrough may further include determining a saturation temperature at a boundary of a steam envelope produced by the injector well, determining a temperature at the producer well bottom hole, and determining a difference between the saturation temperature at the boundary of the steam envelope and the temperature at the producer well bottom hole. In response to a determination that the difference is less than a sub-cool temperature threshold, the method 1700 may include determining the potential of the occurrence of the steam breakthrough.

According to examples, for the method 1700, as disclosed herein with respect to FIG. 16, determining, based on the application of the hypothetical parameter values associated with the operation of the SAGD well 106 to the engineering analysis model associated with the SAGD well 106, the procedure to prevent the occurrence of the steam breakthrough may further include determining, based on the application of the hypothetical parameter values associated with the operation of the SAGD well 106 to the engineering analysis model associated with the SAGD well 106, the procedure that includes reducing a flow rate at the injector well top head 404 to prevent the occurrence of the steam breakthrough.

According to examples, for the method 1700, as disclosed herein with respect to FIG. 11, determining, based on the real-time data 114 associated with the SAGD well 106, the parameter values associated with the operation of the SAGD well 106 may further include determining whether a parameter value of the parameter values is available from the real-time data 114 at a specified time value. In response to a determination that the parameter value is not available at the specified time value, the method 1700 may include applying a regression technique to determining the parameter value.

According to examples, for the method 1700, as disclosed herein with respect to FIG. 12, determining, based on the real-time data 114 associated with the SAGD well 106, the parameter values associated with the operation of the SAGD well 106 may further include determining whether a parameter value of the parameter values is available from the real-time data 114 at a specified time value. In response to a determination that the parameter value is not available at the specified time value, the method 1700 may include determining, based on an analysis of the real-time data 114 for a specified time duration, whether the parameter value of the parameter values becomes available. In response to a determination within the specified time duration that the parameter value of the parameter values becomes available, the method 1700 may include retrieving the parameter value of the parameter values from the real-time data 114. In response to a determination within the specified time duration that the parameter value of the parameter values does not become available, the method 1700 may include assigning a previous parameter value from the real-time data 114 to the parameter value of the parameter values.

Referring to FIGS. 1-16 and 18, and particularly to the method 1800 shown in FIG. 18, at block 1802, the method 1800 may include accessing (e.g., by the SAGD well controller 118) real-time data 114 associated with the SAGD well 106.

At block 1804, the method 1800 may include determining (e.g., by the SAGD well controller 118), based on the real-time data 114 associated with the SAGD well 106, parameter values associated with at least one engineering analysis model associated with the SAGD well 106. Examples of parameter values may include producer well top hole flow rate, injector well top hole flow rate, producer well top hole pressure, producer well bottom hole pressure, injector well top hole pressure, injector well bottom hole pressure, temperature, etc.

At block 1806, as disclosed herein with respect to FIG. 9, the method 1800 may include calibrating, based on an analysis of the parameter values associated with the at least one engineering analysis model associated with the SAGD well 106, the at least one engineering analysis model associated with the SAGD well 106.

At block 1808, the method 1800 may include determining, based on the real-time data 114, attributes of an operation of the SAGD well 106. Examples of attributes may include a determination of whether parameter values such as producer well top hole flow rate, injector well top hole flow rate, producer well top hole pressure, producer well bottom hole pressure, injector well top hole pressure, injector well bottom hole pressure, temperature, volume, etc., meet, exceed, or are below associated threshold requirements.

At block 1810, the method 1800 may include determining, based on an analysis of the attributes of the operation of the SAGD well 106, and the at least one calibrated engineering analysis model associated with the SAGD well 106, a procedure to prevent occurrence of steam breakthrough. For example, as disclosed herein with respect to FIGS. 9 and 10, the SAGD well controller 118 may operate in conjunction with the self-calibrator 120 and the self-learner 122 to determine a procedure to prevent the occurrence of the steam breakthrough.

At block 1812, the method 1800 may include controlling, based on the procedure to prevent the occurrence of the steam breakthrough, the operation of the SAGD well 106 to prevent the occurrence of the steam breakthrough. For example, as disclosed herein with respect to FIGS. 14-16, the SAGD well controller 118 may control the operation of the SAGD well 106 to prevent the occurrence of the steam breakthrough.

According to examples, for the method 1800, as disclosed herein with respect to blocks 900 and 902 of FIG. 9, calibrating, based on the analysis of the parameter values associated with the at least one engineering analysis model associated with the SAGD well 106, the at least one engineering analysis model associated with the SAGD well 106 may further include determining, based on the analysis of the parameter values, a calculated value determined by analyzing the parameter values using the at least one engineering analysis model associated with the SAGD well 106, determining, based on the real-time data 114, an actual value that corresponds to the calculated value, and determining, a difference between the calculated value and the actual value. Further, the at least one engineering analysis model associated with the SAGD well 106 may be calibrated based on the difference between the calculated value and the actual value.

According to examples, for the method 1800, as disclosed herein with respect to block 904 of FIG. 9, calibrating, based on the difference between the calculated value and the actual value, the at least one engineering analysis model associated with the SAGD well 106, may further include determining whether a sign of the difference at a specified time value is equal to a sign of the difference at a previous time value, and determining, whether a magnitude of the difference at the specified time value is greater than or equal to a magnitude of the difference at the previous time value, plus a threshold value. In response to a determination that the sign of the difference at the specified time value is equal to the sign of the difference at the previous time value, and the magnitude of the difference at the specified time value is greater than or equal to the magnitude of the difference at the previous time value, plus the threshold value, as disclosed herein with respect to block 916 of FIG. 9, the method 1800 may include calibrating, based on the difference at the previous time value, the at least one engineering analysis model associated with the SAGD well 106.

According to examples, for the method 1800, as disclosed herein with respect to block 916 of FIG. 9, calibrating, based on the difference at the previous time value, the at least one engineering analysis model associated with the SAGD well 106, may further include determining, a new calculated value based on a difference between the calculated value determined by analyzing the parameter values using the at least one engineering analysis model associated with the SAGD well 106, and the difference at the previous time value. Further, the at least one engineering analysis model associated with the SAGD well 106 may be calibrated by assigning a value of the new calculated value to the calculated value determined by analyzing the parameter values using the at least one engineering analysis model associated with the SAGD well 106.

According to examples, for the method 1800, as disclosed herein with respect to blocks 904 and 906 of FIG. 9, calibrating, based on the difference between the calculated value and the actual value, the at least one engineering analysis model associated with the SAGD well 106, may further include determining, whether a sign of the difference at a specified time value is equal to a sign of the difference at a previous time value, and determining, whether a magnitude of the difference at the specified time value is greater than a magnitude of the difference at the previous time value, plus a threshold value. In response to a determination that the sign of the difference at the specified time value is not equal to the sign of the difference at the previous time value, or the magnitude of the difference at the specified time value is less than the magnitude of the difference at the previous time value, plus the threshold value, a difference between the calculated value and the actual value for a next time value may be analyzed before calibrating, based on the difference between the calculated value and the actual value, the at least one engineering analysis model associated with the SAGD well 106.

Referring to FIGS. 1-16 and 19, and particularly to the method 1900 shown in FIG. 19, at block 1906, the method 1900 may include accessing (e.g., by the SAGD well controller 118) a plurality of procedures to control an operation of the SAGD well 106 to prevent occurrence of steam breakthrough. The plurality of procedures may be determined based on an application of hypothetical parameter values to an engineering analysis model associated with the SAGD well 106.

At block 1908, the method 1900 may include learning (e.g., by the self-learner 122), based on an application of the plurality of procedures to the SAGD well 106, a highest ranked procedure from the plurality of procedures to control the operation of the SAGD well 106 to prevent the occurrence of the steam breakthrough.

At block 1910, the method 1900 may include accessing the real-time data 114 associated with the SAGD well 106.

At block 1912, the method 1900 may include controlling (e.g., by the SAGD well controller 118), based on an analysis of the real-time data 114 associated with the SAGD well 106, the operation of the SAGD well 106 by applying the highest ranked procedure to prevent the occurrence of the steam breakthrough. For example, as disclosed herein with respect to FIGS. 14-16, the SAGD well controller 118 may control the operation of the SAGD well 106 to prevent the occurrence of the steam breakthrough.

According to examples, as disclosed herein with respect to blocks 1000, 1002, 1004, and 1006 of FIG. 10, for the method 1900, accessing the plurality of procedures to control the operation of the SAGD well 106 to prevent the occurrence of the steam breakthrough, may further include determining an actual value associated with the operation of the SAGD well 106 at a specified time value, determining another actual value associated with the operation of the SAGD well 106 at another specified time value, determining a difference between the actual value that corresponds to the specified time value and the other actual value, and determining whether a magnitude of the difference is greater than or equal to a threshold value. In response to a determination that the magnitude of the difference is less than the threshold value, the method 1900 may include determining another difference between the actual value that corresponds to the specified time value and the other actual value at a next time value. Further, the method 1900 may include determining whether the magnitude of the other difference is greater than or equal to the threshold value.

According to examples, as disclosed herein with respect to blocks 1000, 1002, 1004, and 1010 of FIG. 10, for the method 1900, accessing the plurality of procedures to control the operation of the SAGD well 106 to prevent the occurrence of the steam breakthrough, may further include determining an actual value associated with the operation of the SAGD well 106 at a specified time value, determining another actual value associated with the operation of the SAGD well 106 at another specified time value, determining a difference between the actual value that corresponds to the specified time value and the other actual value, and determining whether a magnitude of the difference is greater than or equal to a threshold value. In response to a determination that the magnitude of the difference is greater than or equal to the threshold value, the method 1900 may include applying the plurality of procedures to control the operation of the SAGD well 106 to prevent the occurrence of the steam breakthrough to a simulation based on the at least one engineering analysis model to modify the other actual value, and ranking the plurality of procedures in order of priority for modifying the other actual value.

According to examples, as disclosed herein with respect to blocks 1000, 1002, 1004, 1010, and 1016 of FIG. 10, for the method 1900, learning, based on the application of the plurality of procedures to the SAGD well 106, the highest ranked procedure from the plurality of procedures to control the operation of the SAGD well 106 to prevent the occurrence of the steam breakthrough, may further include determining an actual value associated with the operation of the SAGD well at a specified time value, determining another actual value associated with the operation of the SAGD well 106 at another specified time value, determining a difference between the actual value that corresponds to the specified time value and the other actual value, and determining a ranking of the plurality of procedures in order of priority for modifying the other actual value. Further, the method 1900 may include applying selected procedures of the plurality of ranked procedures to the SAGD well 106 to control the operation of the SAGD well 106 to prevent the occurrence of the steam breakthrough.

According to examples, as disclosed herein with respect to block 1016 of FIG. 10, for the method 1900, applying the selected procedures of the plurality of ranked procedures to the SAGD well 106 to control the operation of the SAGD well 106 to prevent the occurrence of the steam breakthrough, may further include applying the selected procedures of the plurality of ranked procedures to the SAGD well 106 to control the operation of the SAGD well 106 to prevent the occurrence of the steam breakthrough for a time duration until the other actual value decreases.

According to examples, as disclosed herein with respect to block 1020 of FIG. 10, for the method 1900, learning, based on the application of the plurality of procedures to the SAGD well 106, the highest ranked procedure from the plurality of procedures to control the operation of the SAGD well 106 to prevent the occurrence of the steam breakthrough, may further include further ranking, based on the application of the selected procedures of the plurality of ranked procedures to the SAGD well 106 to control the operation of the SAGD well 106 to prevent the occurrence of the steam breakthrough, the selected procedures of the plurality of ranked procedures, and controlling, based on the highest further ranked procedure, the operation of the SAGD well 106 to prevent the occurrence of the steam breakthrough.

According to examples, as disclosed herein with respect to blocks 1018 and 1020 of FIG. 10, for the method 1900, learning, based on the application of the plurality of procedures to the SAGD well 106, the highest ranked procedure from the plurality of procedures to control the operation of the SAGD well 106 to prevent the occurrence of the steam breakthrough, may further include determining whether the other actual value is greater than a minimum specified actual value. In response to a determination that the other actual value is greater than the minimum specified actual value, the method 1900 may include further selecting, based on the application of the selected procedures of the plurality of ranked procedures to the SAGD well 106 to control the operation of the SAGD well 106 to prevent the occurrence of the steam breakthrough, one of the selected procedures of the plurality of ranked procedures to control the operation of the SAGD well 106 to prevent the occurrence of the steam breakthrough, and controlling, based on the further selected procedure, the operation of the SAGD well 106 to prevent the occurrence of the steam breakthrough.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A steam breakthrough detection and prevention apparatus for a steam assisted gravity drainage (SAGD) well, the apparatus comprising:
   a processor; and
   a memory storing machine readable instructions that when executed by the processor cause the processor to:
   access, from at least one sensor associated with the SAGD well, real-time data associated with the SAGD well, wherein
   the SAGD well includes an injector well including an injector well top hole and an injector well bottom hole,
   the SAGD well includes a producer well including a producer well top hole and a producer well bottom hole, and
   the real-time data is collected from at least one of a plurality of components or a plurality of locations of the SAGD well;
   determine, based on the real-time data associated with the SAGD well, parameter values associated with an operation of the SAGD well;
   determine, based on an analysis of selected parameter values from the parameter values associated with the operation of the SAGD well, a potential of occurrence of steam breakthrough;
   determine, based on an application of hypothetical parameter values associated with the operation of the SAGD well to an engineering analysis model associated with the SAGD well, a procedure to prevent the occurrence of the steam breakthrough;
   determine, based on an application of the procedure to the SAGD well, whether the procedure will prevent the occurrence of the steam breakthrough; and in response to a determination that the procedure will prevent the occurrence of the steam breakthrough,
learn the procedure to control the operation of the SAGD well to prevent the occurrence of the steam breakthrough, and
control,
based on an analysis of the potential of the occurrence of the steam breakthrough, and
based on a further application of the procedure to prevent the occurrence of the steam breakthrough to the SAGD well,
the operation of the SAGD well to prevent the occurrence of the steam breakthrough.

2. The steam breakthrough detection and prevention apparatus according to claim 1, wherein the machine readable instructions to determine, based on the analysis of selected parameter values from the parameter values associated with the operation of the SAGD well, the potential of the occurrence of the steam breakthrough further comprise machine readable instructions to cause the processor to:
determine an injector well bottom hole pressure for the injector well bottom hole;
determine a producer well bottom hole pressure for the producer well bottom hole;
determine a difference between the injector well bottom hole pressure and the producer well bottom hole pressure; and
in response to a determination that the difference is less than a pressure differential threshold, determine the potential of the occurrence of the steam breakthrough.

3. The steam breakthrough detection and prevention apparatus according to claim 2, wherein the machine readable instructions to determine, based on the application of the hypothetical parameter values associated with the operation of the SAGD well to the engineering analysis model associated with the SAGD well, the procedure to prevent the occurrence of the steam breakthrough further comprise machine readable instructions to cause the processor to:
determine, based on the application of the hypothetical parameter values associated with the operation of the SAGD well to the engineering analysis model associated with the SAGD well, the procedure that includes reducing a flow rate at the producer well top hole to prevent the occurrence of the steam breakthrough.

4. The steam breakthrough detection and prevention apparatus according to claim 2, wherein the machine readable instructions to determine, based on the application of the hypothetical parameter values associated with the operation of the SAGD well to the engineering analysis model associated with the SAGD well, the procedure to prevent the occurrence of the steam breakthrough further comprise machine readable instructions to cause the processor to:
determine, based on the application of the hypothetical parameter values associated with the operation of the SAGD well to the engineering analysis model associated with the SAGD well, the procedure that includes increasing a pressure at the producer well top hole to prevent the occurrence of the steam breakthrough.

5. The steam breakthrough detection and prevention apparatus according to claim 2, wherein the machine readable instructions to determine, based on the application of the hypothetical parameter values associated with the operation of the SAGD well to the engineering analysis model associated with the SAGD well, the procedure to prevent the occurrence of the steam breakthrough further comprise machine readable instructions to cause the processor to:
determine, based on the application of the hypothetical parameter values associated with the operation of the SAGD well to the engineering analysis model associated with the SAGD well, the procedure that includes manipulating a flow rate at the producer well and a pressure at the injector well to prevent the occurrence of the steam breakthrough.

6. The steam breakthrough detection and prevention apparatus according to claim 1, wherein the machine readable instructions to determine, based on the analysis of selected parameter values from the parameter values associated with the operation of the SAGD well, the potential of the occurrence of the steam breakthrough further comprise machine readable instructions to cause the processor to:
determine a saturation temperature at a boundary of a steam envelope produced by the injector well;
determine a temperature at the producer well bottom hole;
determine a difference between the saturation temperature at the boundary of the steam envelope and the temperature at the producer well bottom hole; and
in response to a determination that the difference is less than a sub-cool temperature threshold, determine the potential of the occurrence of the steam breakthrough.

7. The steam breakthrough detection and prevention apparatus according to claim 6, wherein the machine readable instructions to determine, based on the application of the hypothetical parameter values associated with the operation of the SAGD well to the engineering analysis model associated with the SAGD well, the procedure to prevent the occurrence of the steam breakthrough further comprise machine readable instructions to cause the processor to:
determine, based on the application of the hypothetical parameter values associated with the operation of the SAGD well to the engineering analysis model associated with the SAGD well, the procedure that includes reducing a flow rate at the injector well top hole to prevent the occurrence of the steam breakthrough.

8. The steam breakthrough detection and prevention apparatus according to claim 1, wherein the machine readable instructions to determine, based on the real-time data associated with the SAGD well, the parameter values associated with the operation of the SAGD well further comprise machine readable instructions to cause the processor to:
determine whether a parameter value of the parameter values is available from the real-time data at a specified time value;
in response to a determination that the parameter value is not available at the specified time value, determine, based on an analysis of the real-time data for a specified time duration, whether the parameter value of the parameter values becomes available;
in response to a determination within the specified time duration that the parameter value of the parameter values becomes available, retrieve the parameter value of the parameter values from the real-time data; and
in response to a determination within the specified time duration that the parameter value of the parameter values does not become available, assign a previous parameter value from the real-time data to the parameter value of the parameter values.

9. A method for steam breakthrough detection and prevention for a steam assisted gravity drainage (SAGD) well, the method comprising:
accessing, by at least one processor and from at least one sensor associated with the SAGD well, real-time data associated with the SAGD well, wherein the SAGD well includes an injector well including an injector well top hole and an injector well bottom hole, and the SAGD well includes a producer well including a producer well top hole and a producer well bottom hole;

determining, by the at least one processor, based on the real-time data associated with the SAGD well, parameter values associated with at least one engineering analysis model associated with the SAGD well;

calibrating, by the at least one processor, based on an analysis of the parameter values associated with the at least one engineering analysis model associated with the SAGD well, the at least one engineering analysis model associated with the SAGD well;

determining, by the at least one processor, based on the real-time data, attributes of an operation of the SAGD well;

determining, by the at least one processor, based on an analysis of the attributes of the operation of the SAGD well, and the at least one calibrated engineering analysis model associated with the SAGD well, a procedure to prevent occurrence of steam breakthrough;

learning the procedure to control the operation of the SAGD well to prevent the occurrence of the steam breakthrough; and controlling, by the at least one processor, based on the procedure to prevent the occurrence of the steam breakthrough, the operation of the SAGD well to prevent the occurrence of the steam breakthrough.

10. The method according to claim 9, wherein calibrating, by the at least one processor, based on the analysis of the parameter values associated with the at least one engineering analysis model associated with the SAGD well, the at least one engineering analysis model associated with the SAGD well further comprises:

determining, by the at least one processor, based on the analysis of the parameter values, a calculated value determined by analyzing the parameter values using the at least one engineering analysis model associated with the SAGD well;

determining, by the at least one processor, based on the real-time data, an actual value that corresponds to the calculated value;

determining, by the at least one processor, a difference between the calculated value and the actual value; and calibrating, by the at least one processor, based on the difference between the calculated value and the actual value, the at least one engineering analysis model associated with the SAGD well.

11. The method according to claim 10, wherein calibrating, by the at least one processor, based on the difference between the calculated value and the actual value, the at least one engineering analysis model associated with the SAGD well, further comprises:

determining, by the at least one processor, whether a sign of the difference at a specified time value is equal to a sign of the difference at a previous time value;

determining, by the at least one processor, whether a magnitude of the difference at the specified time value is greater than or equal to a magnitude of the difference at the previous time value, plus a threshold value; and in response to a determination that the sign of the difference at the specified time value is equal to the sign of the difference at the previous time value, and the magnitude of the difference at the specified time value is greater than or equal to the magnitude of the difference at the previous time value, plus the threshold value, calibrating, by the at least one processor, based on the difference at the previous time value, the at least one engineering analysis model associated with the SAGD well.

12. The method according to claim 11, wherein calibrating, by the at least one processor, based on the difference at the previous time value, the at least one engineering analysis model associated with the SAGD well, further comprises:

determining, by the at least one processor, a new calculated value based on a difference between the calculated value determined by analyzing the parameter values using the at least one engineering analysis model associated with the SAGD well, and the difference at the previous time value; and calibrating, by the at least one processor, the at least one engineering analysis model associated with the SAGD well by assigning a value of the new calculated value to the calculated value determined by analyzing the parameter values using the at least one engineering analysis model associated with the SAGD well.

13. The method according to claim 10, wherein calibrating, by the at least one processor, based on the difference between the calculated value and the actual value, the at least one engineering analysis model associated with the SAGD well, further comprises:

determining, by the at least one processor, whether a sign of the difference at a specified time value is equal to a sign of the difference at a previous time value;

determining, by the at least one processor, whether a magnitude of the difference at the specified time value is greater than a magnitude of the difference at the previous time value, plus a threshold value; and in response to a determination that the sign of the difference at the specified time value is not equal to the sign of the difference at the previous time value, or the magnitude of the difference at the specified time value is less than the magnitude of the difference at the previous time value, plus the threshold value, analyzing, by the at least one processor, a difference between the calculated value and the actual value for a next time value before calibrating, based on the difference between the calculated value and the actual value, the at least one engineering analysis model associated with the SAGD well.

14. A non-transitory computer readable medium having stored thereon machine readable instructions to detect and prevent steam breakthrough for a steam assisted gravity drainage (SAGD) well, the machine readable instructions, when executed, cause a processor to:

access a plurality of procedures to control an operation of an SAGD well to prevent occurrence of steam breakthrough, wherein the SAGD well includes an injector well including an injector well top hole and an injector well bottom hole, the SAGD well includes a producer well including a producer well top hole and a producer well bottom hole, and the plurality of procedures are determined based on an application of hypothetical parameter values to at least one engineering analysis model associated with the SAGD well;

learn, based on an application of the plurality of procedures to the SAGD well, a highest ranked procedure from the plurality of procedures to control the operation of the SAGD well to prevent the occurrence of the steam breakthrough;

access, from at least one sensor associated with the SAGD well, real-time data associated with the SAGD well; and control, based on an analysis of the real-time data associated with the SAGD well, the operation of the SAGD well by applying the highest ranked procedure to prevent the occurrence of the steam breakthrough.

15. The non-transitory computer readable medium of claim 14, wherein the machine readable instructions to access the plurality of procedures to control the operation of the SAGD well to prevent the occurrence of the steam breakthrough, when executed, further cause the processor to:

determine an actual value associated with the operation of the SAGD well at a specified time value;

determine another actual value associated with the operation of the SAGD well at another specified time value;

determine a difference between the actual value that corresponds to the specified time value and the other actual value;

determine whether a magnitude of the difference is greater than or equal to a threshold value;

in response to a determination that the magnitude of the difference is less than the threshold value, determine another difference between the actual value that corresponds to the specified time value and the other actual value at a next time value; and determine whether the magnitude of the other difference is greater than or equal to the threshold value.

16. The non-transitory computer readable medium of claim 14, wherein the machine readable instructions to access the plurality of procedures to control the operation of the SAGD well to prevent the occurrence of the steam breakthrough, when executed, further cause the processor to:

determine an actual value associated with the operation of the SAGD well at a specified time value;

determine another actual value associated with the operation of the SAGD well at another specified time value;

determine a difference between the actual value that corresponds to the specified time value and the other actual value;

determine whether a magnitude of the difference is greater than or equal to a threshold value;

in response to a determination that the magnitude of the difference is greater than or equal to the threshold value, apply the plurality of procedures to control the operation of the SAGD well to prevent the occurrence of the steam breakthrough to a simulation based on the at least one engineering analysis model to modify the other actual value; and rank the plurality of procedures in order of priority for modifying the other actual value.

17. The non-transitory computer readable medium of claim 14, wherein the machine readable instructions to learn, based on the application of the plurality of procedures to the SAGD well, the highest ranked procedure from the plurality of procedures to control the operation of the SAGD well to prevent the occurrence of the steam breakthrough, when executed, further cause the processor to:

determine an actual value associated with the operation of the SAGD well at a specified time value;

determine another actual value associated with the operation of the SAGD well at another specified time value;

determine a difference between the actual value that corresponds to the specified time value and the other actual value;

determine a ranking of the plurality of procedures in order of priority for modifying the other actual value; and apply selected procedures of the plurality of ranked procedures to the SAGD well to control the operation of the SAGD well to prevent the occurrence of the steam breakthrough.

18. The non-transitory computer readable medium of claim 17, wherein the machine readable instructions to learn, based on the application of the plurality of procedures to the SAGD well, the highest ranked procedure from the plurality of procedures to control the operation of the SAGD well to prevent the occurrence of the steam breakthrough, when executed, further cause the processor to:

further rank, based on the application of the selected procedures of the plurality of ranked procedures to the SAGD well to control the operation of the SAGD well to prevent the occurrence of the steam breakthrough, the selected procedures of the plurality of ranked procedures; and control, based on the highest further ranked procedure, the operation of the SAGD well to prevent the occurrence of the steam breakthrough.

19. The non-transitory computer readable medium of claim 17, wherein the machine readable instructions to learn, based on the application of the plurality of procedures to the SAGD well, the highest ranked procedure from the plurality of procedures to control the operation of the SAGD well to prevent the occurrence of the steam breakthrough, when executed, further cause the processor to:

determine whether the other actual value is greater than a minimum specified actual value;

in response to a determination that the other actual value is greater than the minimum specified actual value, further select, based on the application of the selected procedures of the plurality of ranked procedures to the SAGD well to control the operation of the SAGD well to prevent the occurrence of the steam breakthrough, one of the selected procedures of the plurality of ranked procedures to control the operation of the SAGD well to prevent the occurrence of the steam breakthrough; and control, based on the further selected procedure, the operation of the SAGD well to prevent the occurrence of the steam breakthrough.

20. The non-transitory computer readable medium of claim 14, further comprising machine readable instructions, when executed, further cause the processor to:

determine whether a steam envelope is closer to a heel of the producer well compared to a toe of the producer well, wherein the heel of the producer well includes a transition from a generally vertical section of the producer well to a generally horizontal section of the producer well;

in response to a determination that the steam envelope is closer to the heel of the producer well, at least one of increase a pressure at the producer well heel or reduce a pressure at the producer well toe; and in response to a determination that the steam envelope is closer to the toe of the producer well, at least one of increase a pressure at the producer well toe or reduce a pressure at the producer well heel.

* * * * *